(12) United States Patent
Siemieniec et al.

(10) Patent No.: US 10,276,670 B2
(45) Date of Patent: Apr. 30, 2019

(54) SEMICONDUCTOR DEVICES AND METHODS FOR FORMING SEMICONDUCTOR DEVICES

(71) Applicant: Infineon Technologies Austria AG, Villach (AT)

(72) Inventors: Ralf Siemieniec, Villach (AT); Li Juin Yip, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/594,058

(22) Filed: May 12, 2017

(65) Prior Publication Data

US 2017/0330964 A1 Nov. 16, 2017

(30) Foreign Application Priority Data

May 13, 2016 (DE) .................. 10 2016 108 934

(51) Int. Cl.
*H01L 29/40* (2006.01)
*H01L 21/28* (2006.01)
(Continued)

(52) U.S. Cl.
CPC ...... *H01L 29/404* (2013.01); *H01L 21/28088* (2013.01); *H01L 21/32133* (2013.01); *H01L 21/76895* (2013.01); *H01L 23/482* (2013.01); *H01L 23/528* (2013.01); *H01L 29/0696* (2013.01); *H01L 29/407* (2013.01); *H01L 29/4236* (2013.01); *H01L 29/4238* (2013.01); *H01L 29/4966* (2013.01); *H01L 29/66734* (2013.01); *H01L 29/7811* (2013.01); *H01L 29/7813* (2013.01); *H01L 29/41741* (2013.01); *H01L 29/45* (2013.01)

(58) Field of Classification Search
CPC ............ H01L 29/7811; H01L 29/0696; H01L 29/404; H01L 29/407; H01L 29/4236; H01L 29/4238; H01L 29/4966; H01L 29/66734; H01L 29/7813; H01L 21/28088; H01L 21/32133; H01L 21/76895; H01L 23/528
See application file for complete search history.

(56) References Cited

U.S. PATENT DOCUMENTS 6,137,135 A * 10/2000 Kubo .................. H01L 29/7813
257/328
6,309,929 B1 * 10/2001 Hsu ...................... H01L 29/0661
257/496

(Continued)

FOREIGN PATENT DOCUMENTS

DE  102005052734 A1  4/2007
DE  102006026943 B4  1/2011

*Primary Examiner* — Eduardo A Rodela
(74) *Attorney, Agent, or Firm* — Murphy, Bilak & Homiller, PLLC

(57) ABSTRACT

A semiconductor device includes an array of needle-shaped trenches extending into a semiconductor substrate. The semiconductor device further includes a gate trench grid extending into the semiconductor substrate. A gate electrode of a transistor structure is located within the gate trench grid. A gate wiring structure of the transistor structure is connected to the gate electrode of the transistor structure. A field electrode located within at least one needle-shaped trench of the array of needle-shaped trenches is connected to the gate wiring structure of the transistor structure.

18 Claims, 18 Drawing Sheets

(51) Int. Cl.
*H01L 21/3213* (2006.01)
*H01L 21/768* (2006.01)
*H01L 23/528* (2006.01)
*H01L 29/06* (2006.01)
*H01L 29/423* (2006.01)
*H01L 29/49* (2006.01)
*H01L 29/66* (2006.01)
*H01L 29/78* (2006.01)
*H01L 23/482* (2006.01)
*H01L 29/417* (2006.01)
*H01L 29/45* (2006.01)

(56) References Cited

U.S. PATENT DOCUMENTS

| | | | |
|---|---|---|---|
| 7,605,427 B2 | 10/2009 | Hirler | |
| 7,652,326 B2* | 1/2010 | Kocon | H01L 21/3065 |
| | | | 257/328 |
| 8,093,655 B2 | 1/2012 | Hirler et al. | |
| 8,642,425 B2* | 2/2014 | Burke | H01L 21/02164 |
| | | | 438/197 |
| 9,806,188 B2* | 10/2017 | Meiser | H01L 29/7813 |
| 2012/0061753 A1 | 3/2012 | Nishiwaki | |
| 2014/0073123 A1* | 3/2014 | Meiser | H01L 21/76877 |
| | | | 438/586 |
| 2016/0020319 A1* | 1/2016 | Laforet | H01L 29/7813 |
| | | | 257/334 |
| 2016/0064477 A1 | 3/2016 | Blank et al. | |
| 2016/0149028 A1* | 5/2016 | Jin | H01L 21/2652 |
| | | | 257/329 |
| 2017/0271491 A1* | 9/2017 | Yip | H01L 21/30604 |

* cited by examiner

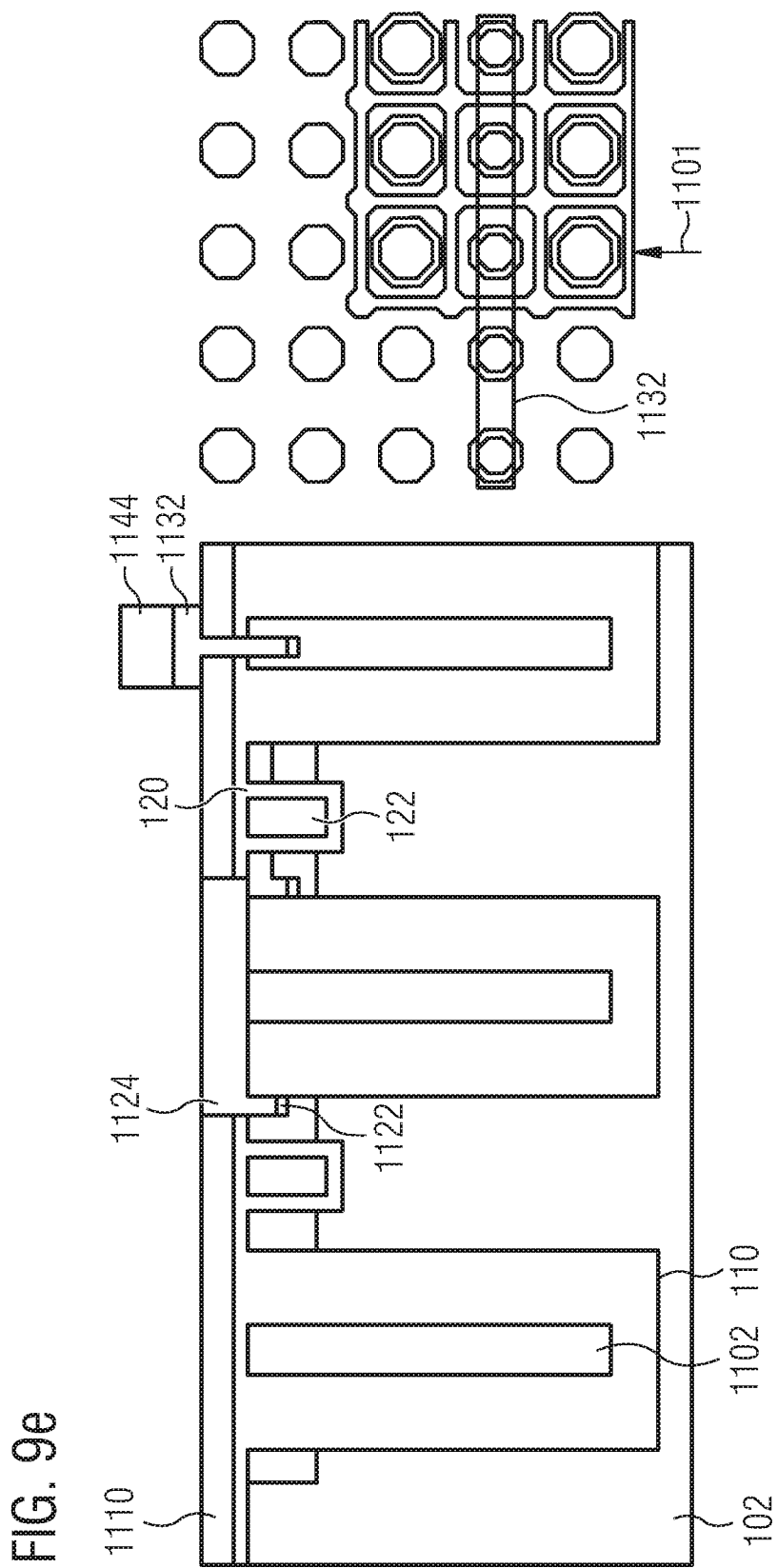

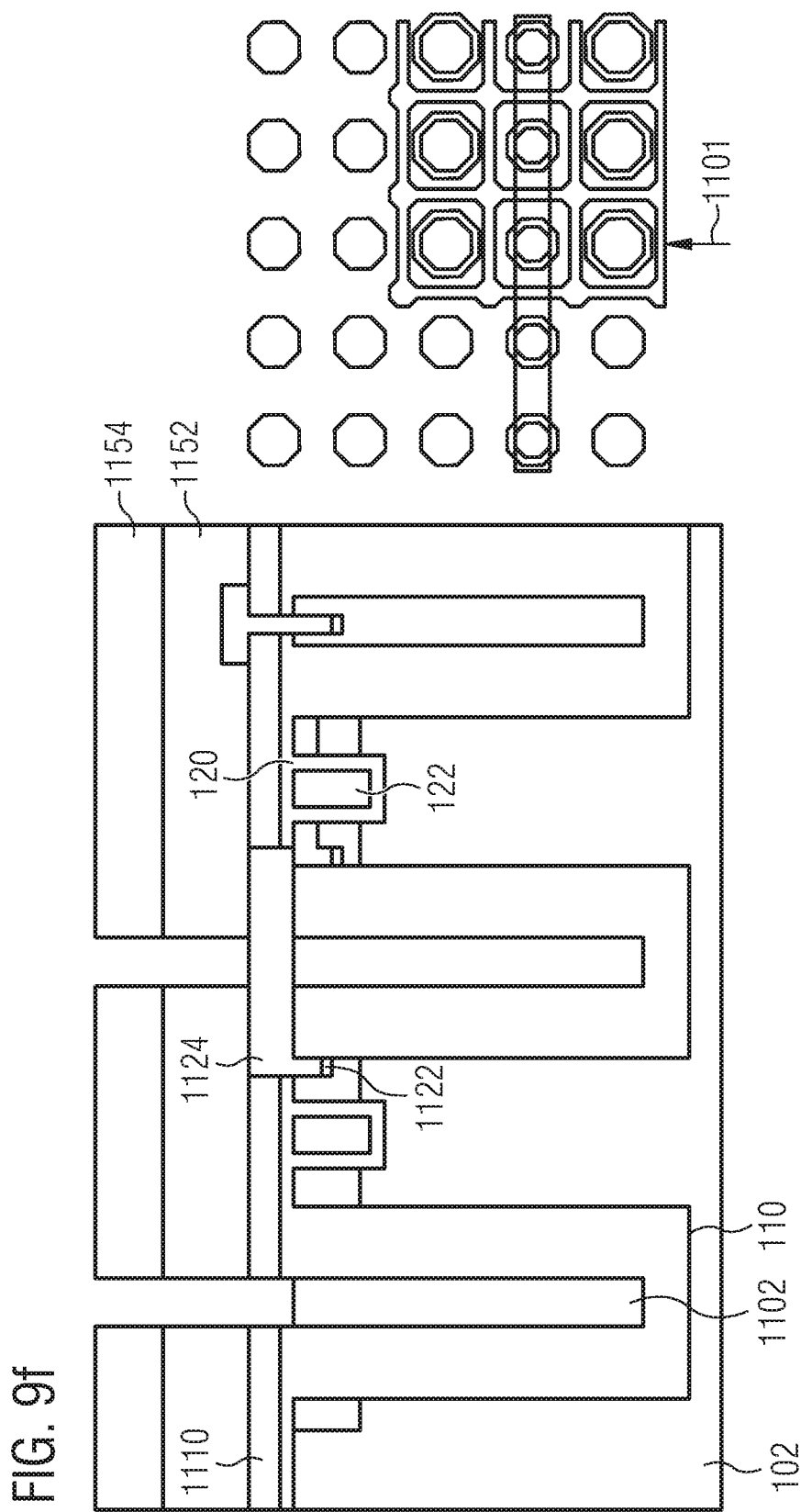

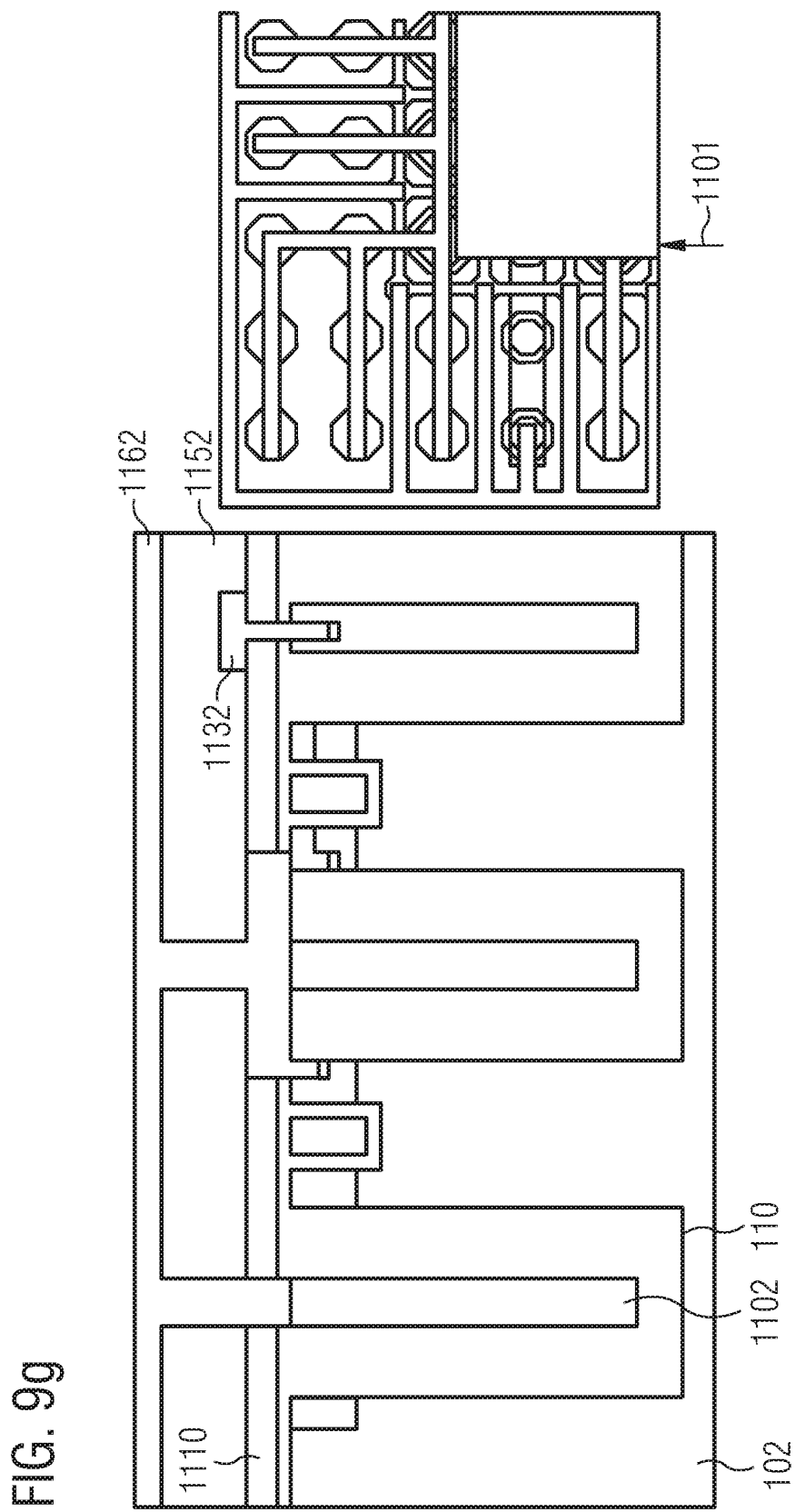

SEMICONDUCTOR DEVICES AND METHODS FOR FORMING SEMICONDUCTOR DEVICES

TECHNICAL FIELD

Embodiments relate to concepts for power semiconductor devices and in particular to semiconductor devices and methods for forming semiconductor devices.

BACKGROUND

Many electronic devices, e.g. for applications as power switches, are desired to have a reduced area-specific on resistance, to minimize the static power dissipation. Compensation devices having an insulated field plate within a trench for charge carrier compensation are used in many areas for low, medium and high breakdown voltages up to 300 V.

SUMMARY

It may be a demand to provide concepts for semiconductor devices, which allow an implementation of semiconductor devices with a high blocking voltage in a desired switching speed range.

Some embodiments relate to a semiconductor device comprising an array of needle-shaped trenches extending into a semiconductor substrate of the semiconductor device. The semiconductor device further comprises a gate trench grid extending into the semiconductor substrate of the semiconductor device. A gate electrode of a transistor structure is located within the gate trench grid. A gate wiring structure of the transistor structure is connected to the gate electrode of the transistor structure. A field electrode located within at least one needle-shaped trench of the array of needle-shaped trenches is connected to the gate wiring structure of the transistor structure.

Some embodiments relate to a semiconductor device comprising an array of needle-shaped trenches extending into a semiconductor substrate of the semiconductor device. The semiconductor device further comprises a gate trench grid extending into the semiconductor substrate of the semiconductor device. A gate electrode of a transistor structure is located within the gate trench grid. The semiconductor device further comprises a gate-trench-like trench. A trench electrode located within the gate-trench-like trench is connected to a source wiring structure of the transistor structure.

Some embodiments relate to a method for forming a semiconductor device. The method comprises forming an array of needle-shaped trenches extending into a semiconductor substrate of the semiconductor device. The method further comprises forming field electrodes within the array of needle-shaped trenches. The method further comprises forming a gate trench grid extending into the semiconductor substrate of the semiconductor device. The method further comprises forming a gate electrode of a transistor structure within the gate trench grid. The method further comprises forming a gate wiring structure connected to the gate electrode of the transistor structure and connected to at least one field electrode located within a needle-shaped trench of the array of needle-shaped trenches.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which:

FIG. 7b shows a schematic cross section of the semiconductor device shown in FIG. 7a:

FIG. 9a-g show schematic cross sections and top views of a part of a semiconductor device at different manufacturing stages;

DETAILED DESCRIPTION

Figure 1:
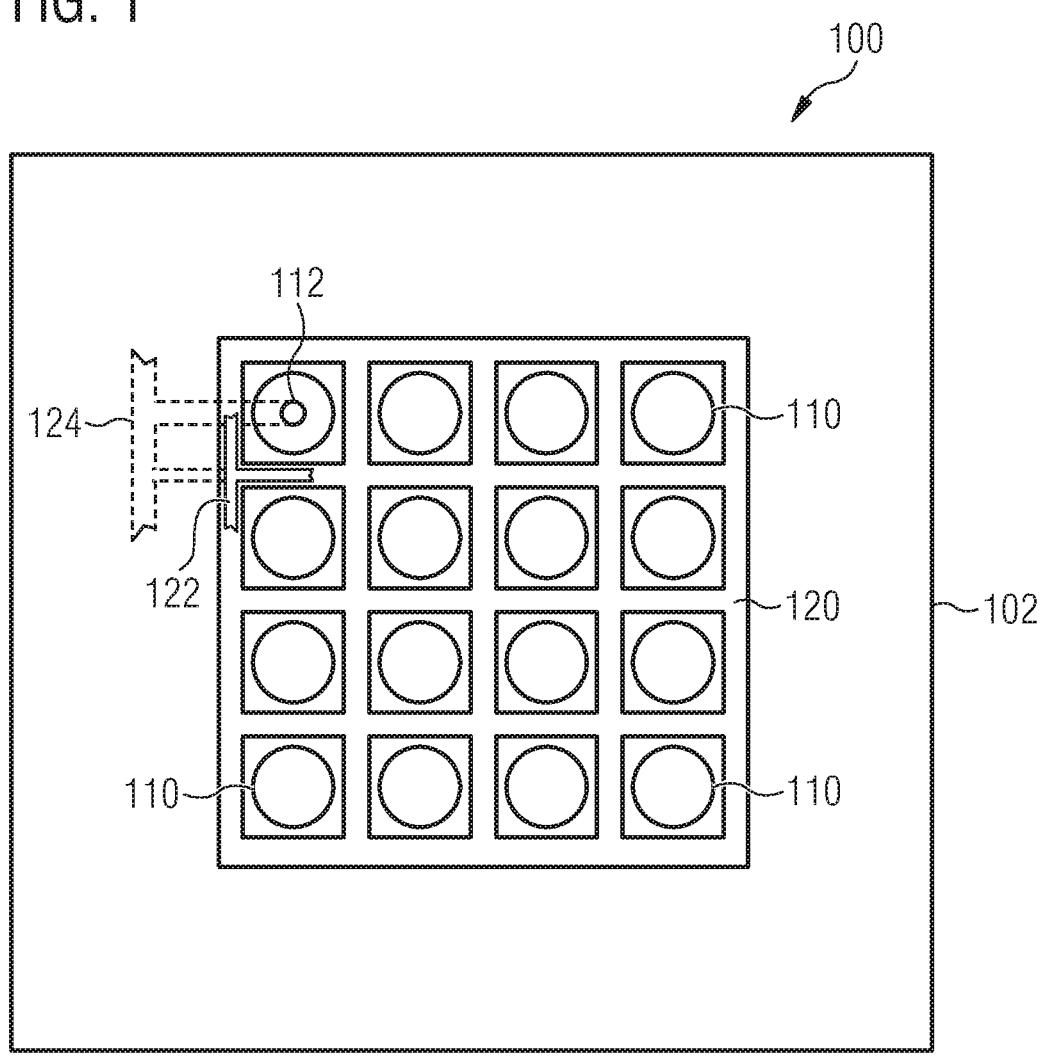
FIG. 1 shows a schematic illustration of a semiconductor device comprising an array of needle-shaped trenches and a gate trench grid in top view.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

MOSFET (Metal-Oxide-Semiconductor Field-Effect Transistors) using a field-plate for charge compensation may offer a significant improvement of the area-specific resistance. For example, deep trenches containing the field-plates in the center surrounded by a separate gate trench may result in a larger cross section of the mesa region. This may lead to a further reduction of the overall on-resistance ($R_{dson}$).

For example, the gate might not be integrated into the field-plate trench but moved into a separate gate trench, e.g. to enable that the device can also be manufactured as it may be difficult to realize separate, insulated contacts to the field-plate and a gate-electrode being in the same trench—at least in case of lower voltage applications where dimensions may be small.

FIG. 1 shows a schematic top view of a semiconductor device 100 according to an embodiment. The semiconductor device 100 comprises an array of needle-shaped trenches 110 extending into a semiconductor substrate 102 of the semiconductor device. The semiconductor device 100 further comprises a gate trench grid 120 extending into the semiconductor substrate 102 of the semiconductor device. A gate electrode 122 of a transistor structure is located within the gate trench grid 120. A gate wiring structure 124 of the transistor structure is connected to the gate electrode of the transistor structure. Further, a field electrode 112 located within at least one needle-shaped trench of the array of needle-shaped trenches 110 is connected to the gate wiring structure 124 of the transistor structure.

By connecting at least one field electrode 112 located within a needle-shaped trench to the gate wiring structure 124, a capacitance of the gate may be increased, e.g. to decrease a switching speed, while maintaining a low on-resistance. In this way, the switching speed may be reduced and/or adapted to a desired switching speed for a specific application.

For example, field electrodes are located within all or within a plurality of needle-shaped trenches of the array of needle-shaped trenches 110. A field electrode within a needle-shaped trench may be either connected to the gate wiring structure or connected to a source wiring structure of the transistor structure, for example. For example, at least one field electrode located within a needle-shaped trench of the array of needle-shaped trenches 110 may be connected to a source wiring structure of the transistor structure.

The needle-shaped trenches of the array of needle-shaped trenches 110 may comprise a maximal lateral extension (e.g. in one lateral direction) of less than 2 times a minimal lateral extension (e.g. in another lateral direction), for example. For example, a needle-shaped trench comprising a lateral circular shape has a maximal lateral dimension equal to a minimal lateral dimension or a needle-shaped trench comprising a lateral square shape has a maximal lateral dimension equal to the length of a diagonal of the square and a minimal lateral dimension equal to the length of a side of the square. The needle-shaped trenches of the array of needle-shaped trenches 110 may comprise a minimal lateral dimension of more than 200 nm and/or less than 10 μm (or more than 500 nm and/or less than 3 μm), for example. Further, the needle-shaped trenches of the array of needle-shaped trenches 110 may comprise a depth of more than the minimal lateral extension and/or more than the maximal lateral dimension. For example, the needle-shaped trenches of the array of needle-shaped trenches 110 may extend into a depth of more than 10 μm (or more than 20 μm, more than 50 μm or more than 80 μm). The needle-shaped trenches of the array of needle-shaped trenches 110 may comprise a lateral geometry being one of a rectangular geometry, square geometry, round geometry, hexagonal geometry and octagonal geometry, for example.

The needle-shaped trenches of the array of needle-shaped trenches 110 may be distributed periodically over at least a portion (e.g. cell region) of the semiconductor substrate 102. The array of needle-shaped trenches 110 may be distributed in a two-dimensional grid of substantially equal distances, for example. For example, the array of needle-shaped trenches 110 may be distributed in a square grid, a rectangular grid, a staggered grid or a hexagonal grid. For example, the array of needle-shaped trenches 110 may comprise more than 50 (or more than 100, more than 200 or more than 500) needle-shaped trenches 110.

The gate trench grid 120 may comprise a contiguous grid formed by an uninterrupted gate trench. A gate trench may house a gate electrode and a transistor channel to be controlled by the gate electrode may be located adjacent to the gate trench. A gate potential may be applied to the gate electrode within the gate trench through the gate wiring structure 124 during operation of the semiconductor device 100. The gate trench of the gate trench grid may laterally surround at least a subset of the needle-shaped trenches of the array of needle-shaped trenches 110. For example, the gate trench of the gate trench grid 120 may be located laterally between (e.g. every) neighboring needle-shaped trenches of the array of needle-shaped trenches 110. For example, the gate trench grid 120 may be a square grid (e.g. with a single needle-shaped trench located in every square), a rectangular grid (e.g. with a single needle-shaped trench located in every rectangle), a staggered grid or a hexagonal grid (e.g. with a single needle-shaped trench located in every hexagon). For example, a depth of the needle-shaped trenches of the array of needle-shaped trenches 110 may be larger than two times (or larger than 5 times or larger than 10 times) a depth of the gate trench grid 120. For example, the gate trench grid 120 may extend vertically to a depth of more than 200 nm (more than 500 nm or more than 1 μm) into the semiconductor substrate 102. For example, a minimal width of the trench of the gate trench grid 120 may be less than 50% (or less than 30% or less than 10%) of a minimal lateral dimension of the needle-shaped trenches of the array of needle-shaped trenches 110. For example, the gate trench grid may comprise a minimal lateral dimension of less than 500 nm (or less than 300 nm or less than 200 nm).

The semiconductor device 100 may comprise more than one gate trench grid 120. For example, the semiconductor device 100 may comprise a plurality of transistor structures comprising individual gate trench grids or the transistor structure of the semiconductor device 100 comprises more than one gate trench grids connected to the gate wiring structure 124.

For example, a plurality of needle-shaped trenches of the array of needle-shaped trenches 110 comprise field electrodes may be connected to the gate wiring structure 124. By increasing the number of field electrodes connected to the gate wiring structure 124, the switching speed of the transistor structure may be reduced. The plurality of needle-shaped trenches of the array of needle-shaped trenches 110 comprising field electrodes connected to the gate wiring structure 124 may be arranged in rows (or columns). The rows may be periodically distributed over a cell region 108 of the semiconductor substrate. For example, the field electrodes of every second (or every third or every n-th) row of needle-shaped trenches of the array of needle-shaped trenches 110 may be connected to the gate wiring structure 124. For example, field electrodes within needle-shaped trenches of the array of needle-shaped trenches 110 not connected to the gate wiring structure 124 may be connected to a source wiring structure of the transistor structure.

For example, a plurality of needle-shaped trenches of the array of needle-shaped trenches 110 may comprise field electrodes connected to the source wiring structure. The plurality of needle-shaped trenches of the array of needle-shaped trenches 110 comprising field electrodes connected to the source wiring structure may be periodically distributed over a cell region 108 of the semiconductor device, for example. The periodic distribution may be equidistant in one lateral direction or equidistant in two lateral directions, for example. The periodic distribution may be based on a repetitive pattern, e.g. a hexagon or a Cartesian array, for example, which may be repeated in one or two lateral directions, for example.

For example, a number of needle-shaped trenches of the array of needle-shaped trenches 110 comprising field electrodes connected to the source wiring structure of the transistor structure may be larger than (e.g. larger than twice, larger than 5 times or larger than 10 times) a number of needle-shaped trenches of the array of needle-shaped trenches 110 comprising field electrodes connected to the gate wiring structure 124 of the transistor structure.

The field electrodes may enable to vertically enlarge a depletion region of the transistor structure in a blocking state of the transistor structure by bounding free charge carriers and may enable a higher blocking voltage, for example. By selectively connecting field electrodes to the source wiring structure or the gate wiring structure, the capacitance of the gate may be set to a desired value, for example. In this way, a selection of the gate capacitance of the semiconductor device 100 may be enabled by changing the layout of only one lithography mask for manufacturing. In contrast to the gate electrode 122 within the gate trench grid 120, the field electrodes do not control a channel of a transistor, for example. For example, the field electrodes located in the plurality of needle-shaped trenches of the array of needle-shaped trenches 110 are no gate electrodes of transistors. No gate electrode may be located in the needle-shaped trenches of the array of needle-shaped trenches. For example, a field electrode may be connected to the source wiring structure, may be located in a needle-shaped trench without a transistor channel or a source region of a transistor located (directly) adjacent to the needle-shaped trench and/or may be insulated from the semiconductor substrate by a field insulation layer comprising a significantly larger thickness as a gate insulation layer so that the field electrode does not cause a conductive channel within the semiconductor substrate 102 along the needle-shaped trench during normal operation of the semiconductor device.

The field electrodes within the needle-shaped trenches of the array of needle-shaped trenches may be insulated from the semiconductor substrate 102 by a field insulation layer within the needle-shaped trenches. The gate electrode 122 within the gate trench grid 120 may be insulated from a channel region of the transistor structure located within the semiconductor substrate 102 by a gate insulation layer within the gate trench grid 120. For example, a thickness of the field insulation layer may be larger than two times (or larger than 5 times or larger than 10 times) a thickness of the gate insulation layer. The field insulation layer located within the needle-shaped trenches and/or the gate insulation layer within the gate trench grid 120 may be oxide layers, for example. The field electrodes and the gate electrode 122 may comprise poly silicon, for example.

The field electrodes within the needle-shaped trenches of the array of needle-shaped trenches may extend deeper into the semiconductor substrate than the gate electrode 122. For example, a maximal depth of a field electrode within a needle-shaped trench of the array of needle-shaped trenches may be larger than 2 times (or larger than 3 times or larger than 5 times) a maximal depth of the gate electrode 122 within the gate trench grid 120. The maximal depth may be measured from a surface of the semiconductor substrate vertically into the semiconductor substrate.

The source wiring structure is located outside (e.g. above) the semiconductor substrate 102, for example. The source wiring structure may be connected to the semiconductor substrate 102 (e.g. connected to one or more source doping regions of the transistor structure). For example, the source wiring structure may comprise metal (e.g. aluminum, copper and/or tungsten) and/or polysilicon, and may comprise traces, lines, layers and/or vias. The source wiring structure may comprise a barrier layer and a metal layer (e.g. tungsten), for example. The barrier layer may comprise titanium Ti, titanium nitride TiN and/or titanium tungsten TiW, for example. For example, the barrier layer may comprise two or more sub-layers comprising titanium, titanium nitride and/or titanium tungsten, for example. The source wiring structure may connect source doping regions of the semiconductor device (e.g. of the transistor structure) to a source contact interface (e.g. source pad) for connecting an external electrical device or an external source potential to one or more source regions of the transistor structure, for example. The source wiring structure may correspond to or comprise a source grid or one or more source metal layers.

The gate wiring structure 124 is located outside the semiconductor substrate 102, for example. The gate wiring structure 124 is at least connected to gate electrodes of transistor structure of the semiconductor substrate 102, for example. For example, the gate wiring structure 124 may comprise metal (e.g. aluminum, copper and/or tungsten) and/or polysilicon, and may comprise traces, lines, layers and/or vias. The gate wiring structure may comprise a barrier layer and a metal layer (e.g. tungsten), for example. The barrier layer may comprise titanium Ti, titanium nitride TiN and/or titanium tungsten TiW, for example. For example, the barrier layer may comprise two or more sub-layers comprising titanium, titanium nitride and/or titanium tungsten, for example. The gate wiring structure 124 may connect gate electrodes of the semiconductor device to a gate driver circuit implemented on the semiconductor substrate 102 or a gate contact interface (e.g. gate pad) for connecting an external electrical device to one or more gate electrodes of the transistor structure, for example. The gate wiring structure 124 may correspond to or comprise a gate grid and/or a gate metal layer, for example.

The semiconductor substrate 102 may be a silicon substrate. Alternatively, the semiconductor substrate 102 may be a wide band gap semiconductor substrate having a band gap larger than the band gap of silicon (1.1 eV). For example, the semiconductor substrate 102 may be a silicon carbide (SiC)-based semiconductor substrate, or gallium arsenide (GaAs)-based semiconductor substrate, or a gallium nitride (GaN)-based semiconductor substrate. The semiconductor substrate 102 may be a semiconductor wafer or a semiconductor die.

For example, the vertical direction and a vertical dimension or thicknesses of layers may be measured orthogonal to a front side surface of the semiconductor substrate 102 and a lateral direction and lateral dimensions may be measured in parallel to the front side surface of the semiconductor substrate 102.

The semiconductor substrate 102 may comprise a cell region (or active region) laterally surrounded by an edge termination region. The cell region may be a region of the semiconductor substrate 102 used to conduct more than 90% of a current through the semiconductor substrate 102 in an on-state or conducting state of the transistor structure (or the whole semiconductor device). The edge termination region may be located between an edge of the semiconductor substrate 102 and the cell region in order to support or block or reduce or dissipate a maximal voltage applied between the front side surface of the semiconductor substrate 102 and a back side surface of the semiconductor substrate 102 within the cell region laterally towards the edge of the semiconductor substrate 102. For example, the needle-shaped trenches of the array of needle-shaped trenches 110 are arranged within the cell region of the semiconductor substrate 102 of the semiconductor device 100. The semiconductor device 100 may further comprise a plurality of edge termination needle-shaped trenches located within the edge termination region laterally surrounding the cell region of the semiconductor device 100. The plurality of edge termination needle-shaped trenches may comprise field electrodes connected to the source wiring structure of the transistor structure. The plurality of edge termination needle-shaped trenches may improve the reliability of the edge termination and/or enables an increase of a maximally bearable voltage applied to the semiconductor device 100.

The transistor structure (e.g. insulated gate field effect transistor, metal-oxide-semiconductor field effect transistor or insulated gate bipolar transistor) may be a vertical transistor structure conducting current between a front side surface of the semiconductor substrate 102 a back side surface of the semiconductor substrate 102. For example, the transistor structure of the semiconductor device comprises a plurality of source doping regions connected to a source wiring structure, a plurality of gate electrodes or a gate electrode grid connected to a gate wiring structure and a back side drain metallization.

The semiconductor device 100) may be a power semiconductor device. A power semiconductor device or an electrical structure (e.g. transistor structure of the semiconductor device) of the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V), for example.

Figure 2:
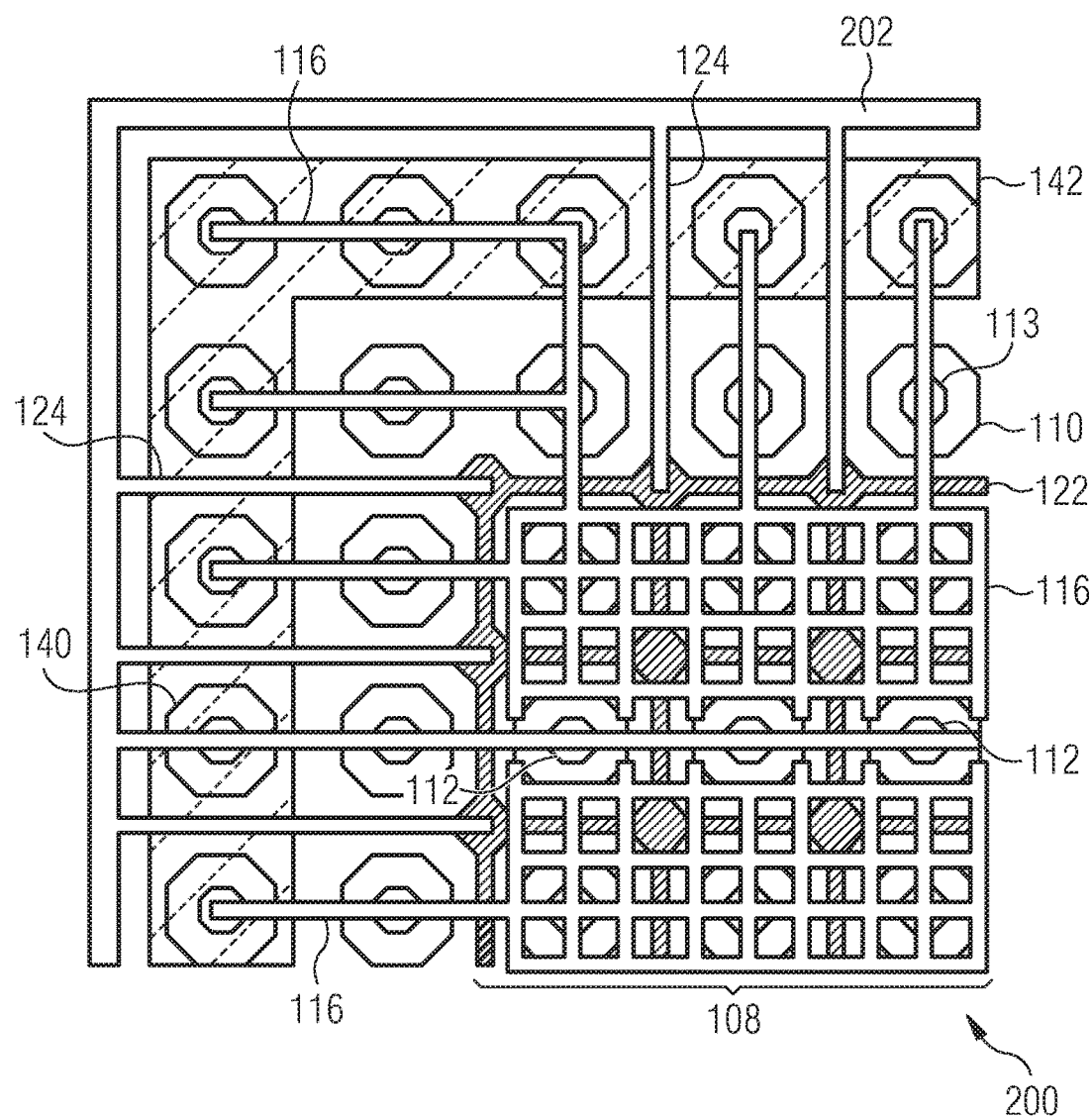
FIG. 2 shows a schematic illustration of a semiconductor device comprising an array of needle-shaped trenches, a gate trench grid, a source wiring structure and a gate wiring structure in top view.

FIG. 2 shows a schematic top view of a semiconductor device 200 according to an embodiment. The implementation of the semiconductor device 200 is similar to the implementation shown in FIG. 1. The semiconductor device 200 (e.g. power MOSFET) uses an array of needle-shaped trenches 110 with field-plate electrodes and a gate trench grid. The required wiring, e.g. of the source wiring structure 116 or the gate wiring structure 124, may be implemented using one (e.g. only one or more than one) conductive layer, for example (e.g. aluminum, copper or tungsten layer). This layer may first be deposited and afterwards structured for example, e.g. using an anisotropic etching. Further, a gate electrode is located within the gate trench grid being connected to the gate wiring structure 124. The gate wiring structure 124 comprises a gaterunner 202 (e.g. connected to a gate pad) surrounding the cell region of the semiconductor device 200. A gate electrode located within a gate trench grid (gate grid) is connected to the gate wiring structure 124 (e.g. at an edge of the cell region). A source wiring structure 116 (e.g. source grid) is connected to field plates 113 within needle-shaped trenches 110 (e.g. field-plate trenches) except for some field plates 112 within needle-shaped trenches 110, which are connected to the gate wiring structure 124. FIG. 2 further shows a cell region 108 and an edge termination region 142 comprising edge termination needle-shaped trenches 140. For example, the row of needle-shaped trenches located adjacent to the needle-shaped trenches of the cell region 108 may be part of the edge termination region 142 as well.

FIG. 2 shows an example of a MOSFET using needle-trenches 110 with field-plates 113 for charge compensation. The gates form a grid. The required wiring can be done by just one conductive layer (e.g. gate wiring and source wiring), for instance formed by tungsten, which is first deposited and afterwards structured. This results in the gate being connected to the gaterunner (and finally the gate pad) and in a connection of a desired number of field-plates and source regions of the cells which do form a source grid here, for example. FIG. 2 does not include the power metal (e.g. AlCu (an Aluminum Copper alloy), AlSiCu (an Aluminum Copper Silicon alloy) or the like) on top as it is included in FIG. 3.

The gate trench grid and needle-shaped trench electrodes on gate potential may be connected to a gate runner via connecting lines, for example. The source contacts and the needle-shaped trench electrodes on source potential may be connected to the source metal via plugs, for example, e.g. there might not be an uninterrupted source grid below the power metal, for example.

Figure 3:
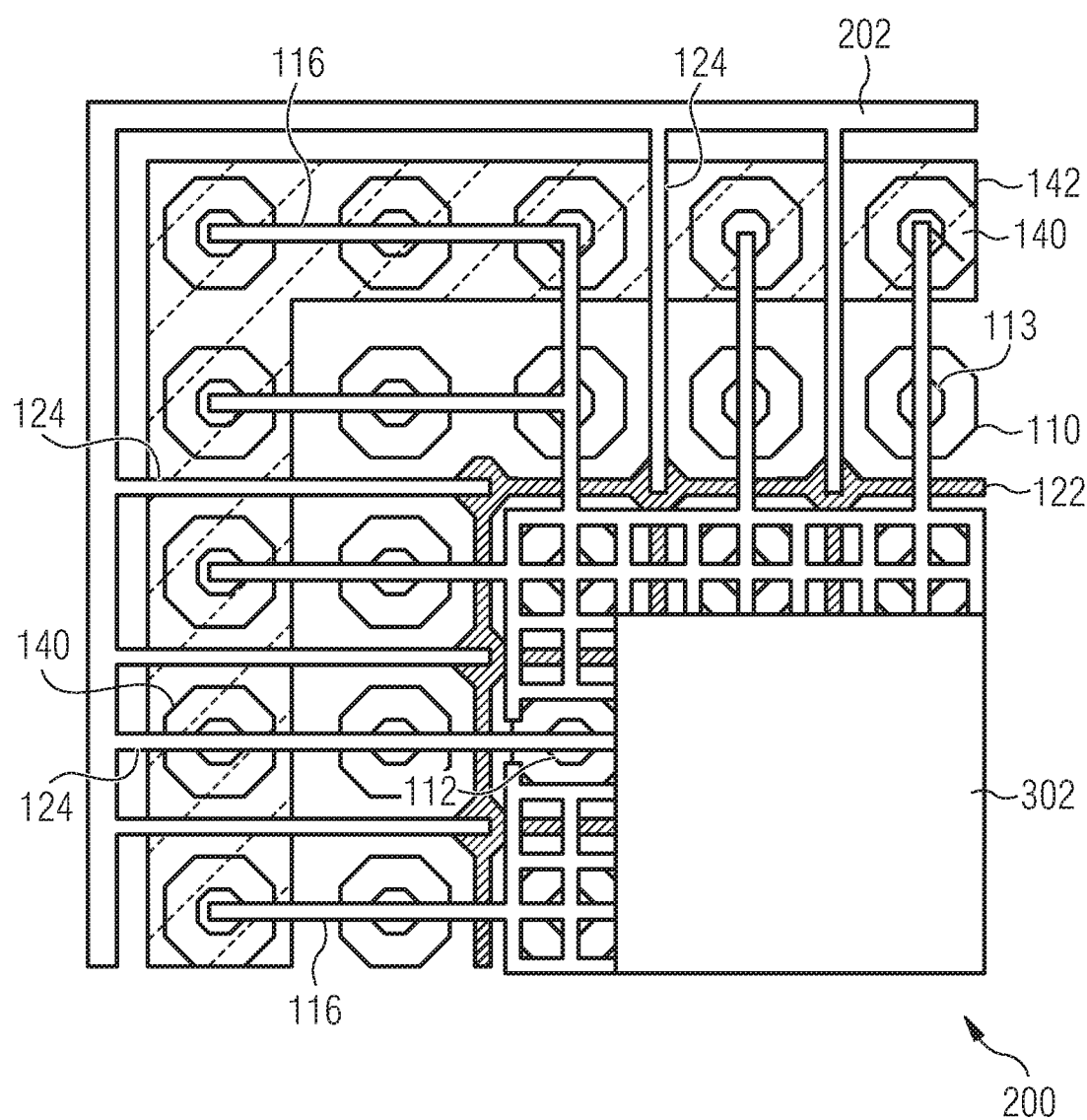
FIG. 3 shows a schematic illustration of the semiconductor device shown in FIG. 2 additionally showing a power metal in top view.

FIG. 2 shows an example of layout measures for a device 200 having (some) field plates 112 connected to the gate wiring. In the example shown only a part of the field-plates is connected with gate, however this can be done for all field-plates in another example. No insulation layers are shown in FIG. 2, however these are included in the cross sections shown in FIG. 9a-9g, for example. FIG. 3 adds the power metal 302 on top which is connecting the separate parts of the source grid.

To realize this approach a process sequence can be used as proposed in FIG. 9a-9g, which may need an additional tungsten layer and its structuring compared to the other process flows.

More details and aspects of the semiconductor device 200 are mentioned in connection with the proposed concept or one or more examples described above or below (e.g. FIG. 1 or 4 to 11). The semiconductor device 200 may comprise one or more additional optional features corresponding to one or more aspects of the proposed concept or one or more examples described above (e.g. FIG. 1) or below (e.g. FIG. 4-11).

Figure 4:
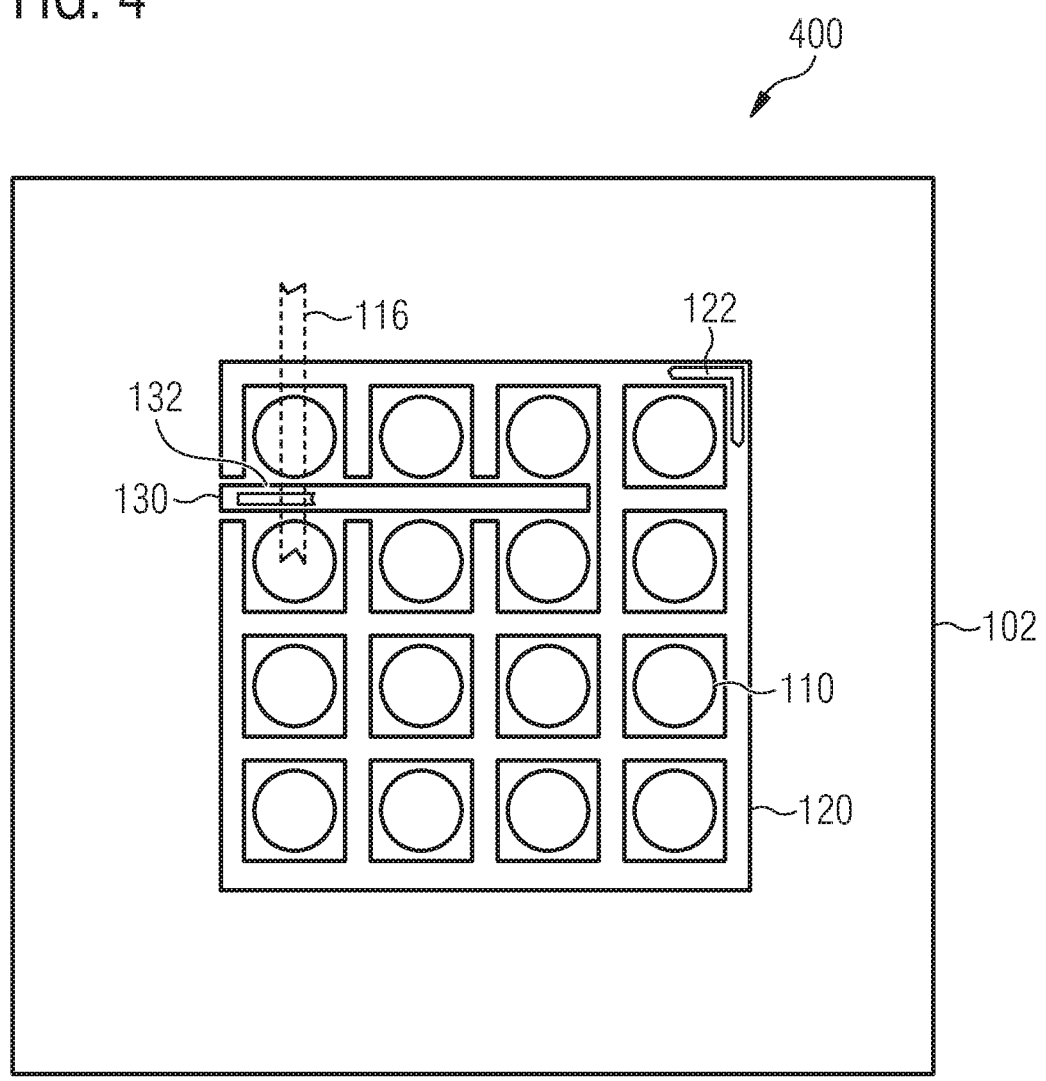
FIG. 4 shows a schematic illustration of a semiconductor device comprising an array of needle-shaped trenches, a gate trench grid and a gate-trench-like trench in top view.

FIG. 4 shows a schematic top view of a semiconductor device 400 according to an embodiment. The semiconductor device 400 comprises an array of needle-shaped trenches 110 extending into a semiconductor substrate 102 of the semiconductor device. The semiconductor device 400 further comprises a gate trench grid 120 extending into the semiconductor substrate 102 of the semiconductor device. A gate electrode 122 of a transistor structure is located within the gate trench grid 120. The semiconductor device 400 further comprises a gate-trench-like trench 130. A trench electrode 132 located within the gate-trench-like trench 130 is connected to a source wiring structure 116 of the transistor structure.

By implementing a gate-trench-like trench with a trench electrode connected to the source wiring structure a semiconductor device with a reduced gate capacitance may be provided. In this way, the maximal switching speed of the semiconductor device may be increased.

The gate-trench-like trench 130 may be manufactured simultaneously with the gate trench grid 120. The gate-trench-like trench 130 may comprise a similar geometry as the gate trench grid 120 in a cross section. For example, a depth of the gate-trench-like trench 130 may differ from a depth of the gate trench grid 120 by less than 10% of the depth of the gate trench grid 120. Further, a minimal width of the gate-trench-like trench 130 may differ from a minimal width of the gate trench grid 120 by less than 10% of the minimal width of the gate trench grid 120. For example, the gate-trench-like trench 130 comprises a depth and a minimal lateral dimension closer to a depth and a minimal lateral dimension of the gate trench grid 120 than to a depth and a minimal lateral dimension of a needle-shaped trench 110 of the array of needle-shaped trenches 110. The trench electrode 132 located within the gate-trench-like trench may be implemented similar to the gate electrode 122, for example.

For example, the field electrodes within the array of needle shaped trenches may be connected to the source wiring structure as well (e.g. alternatively, the field electrodes are connected to another wiring structure connectable to a defined potential).

For example, the gate-trench-like trench 130 and the gate trench grid 120 are laterally separated from each other by semiconductor material of the semiconductor substrate 102. For example, a smallest lateral distance between the gate trench grid 120 and the gate-trench-like trench 130 may be larger than 200 nm and/or lower than 2 μm (or larger than 500 nm and/or lower than 1 μm).

For example, the semiconductor device 400 may comprise a plurality of gate-trench-like trenches 130 located within a cell region of the semiconductor substrate. The plurality of gate-trench-like trenches 130 may be spaced apart from each other by substantially equal distances, for example. The plurality of gate-trench-like trenches 130 may be spaced apart from each other in increments of distances of rows or columns of the gate trench of the gate trench grid 120, for example.

For example, a sub-structure of the gate trench grid 120 may surround at least three sides of needle-shaped trenches of the array of needle-shaped trenches 110, for example. For example, each needle-shaped trench of a sub-set of needle-shaped trenches 110 or all needle-shaped trenches 110 of the array of needle-shaped trenches 110 located within the cell region of the semiconductor substrate 102 are individually laterally surrounded by the gate trench of the gate trench grid 120 to a degree of at least 180° of a circumference of the needle-shaped trenches 110 (e.g. each single needle-shaped trench may be completely surrounded or more than 180° or more than 270° of a circumference of the needle-shaped trench is surrounded).

More details and aspects of the semiconductor device 400 are mentioned in connection with the proposed concept or one or more examples described above or below (e.g. FIG. 1 to 3, 5 to 11). The semiconductor device 400 may comprise one or more additional optional features corresponding to one or more aspects of the proposed concept or one or more examples described above or below.

Figure 5:
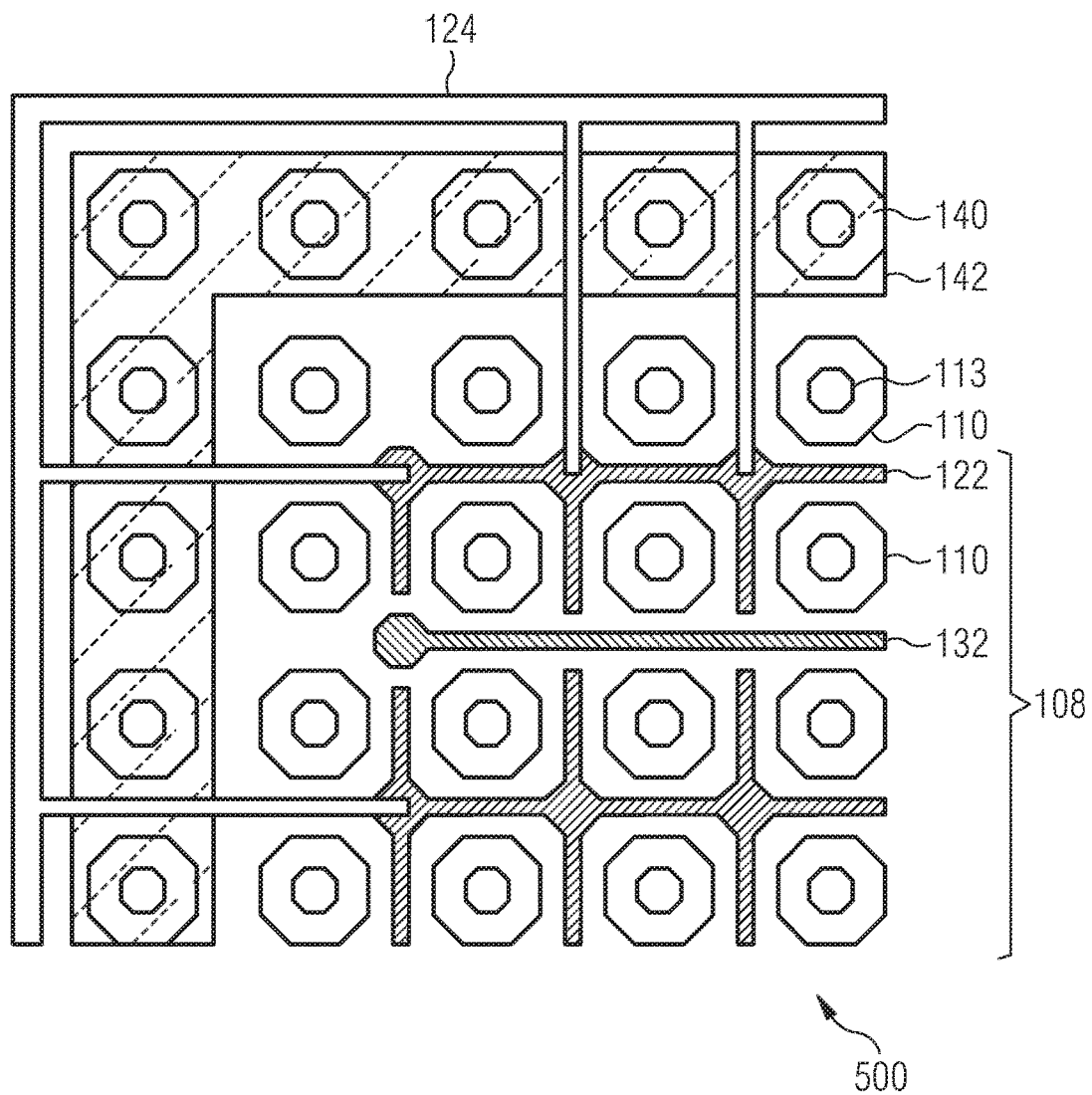
FIG. 5 shows a schematic illustration of a semiconductor device comprising an array of needle-shaped trenches, a gate trench grid, a gate-trench-like trench and a gate wiring structure in top view.
Figure 6:
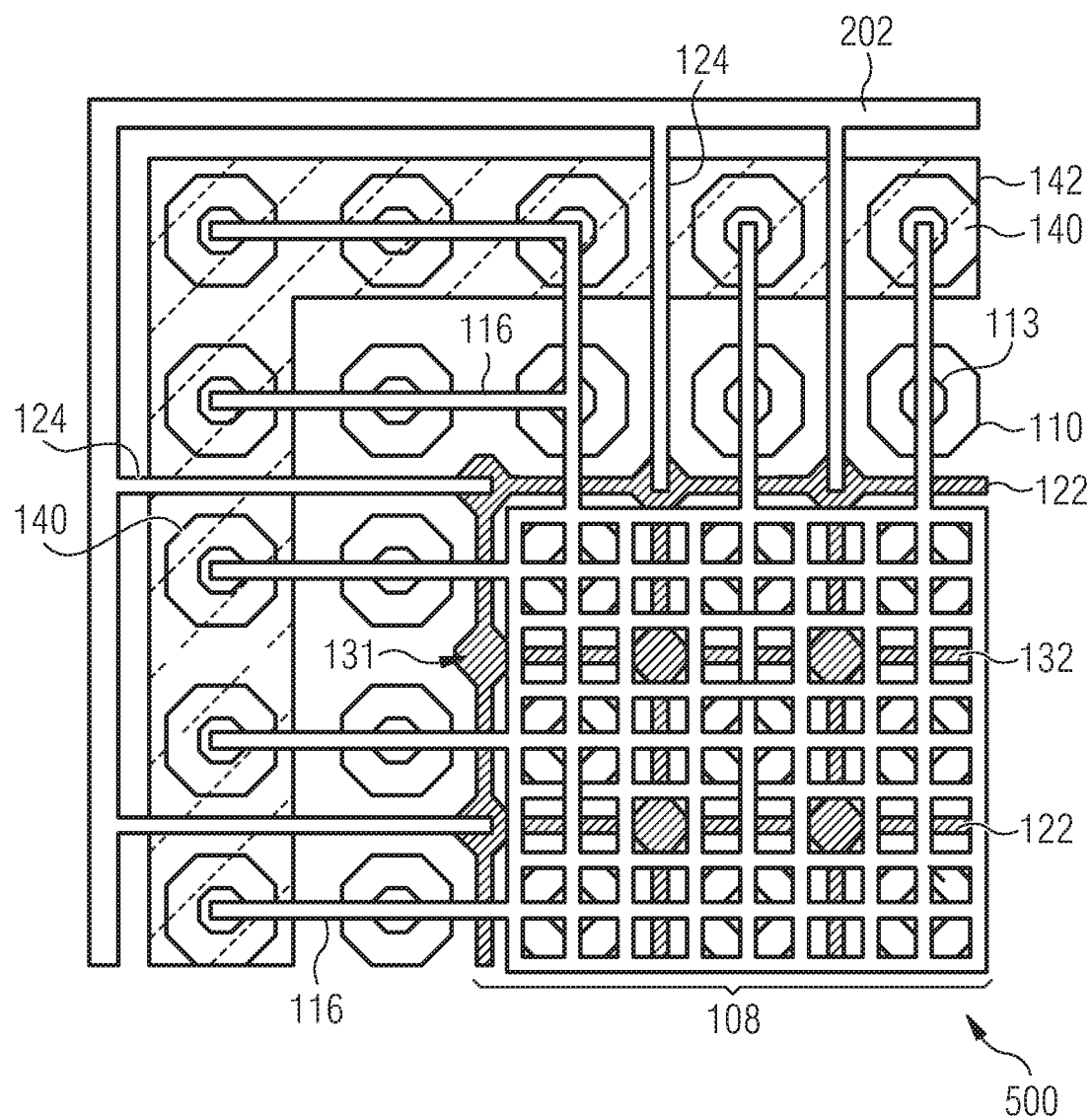
FIG. 6 shows a schematic illustration of the semiconductor device shown in FIG. 5 additionally showing a source wiring structure in top view.

FIGS. 5 and 6 show schematic top views of a semiconductor device 500 according to an embodiment. The implementation of the semiconductor device 500 is similar to the implementation shown in FIG. 4 and FIG. 2. In comparison to the example shown in FIG. 2, all field plates 113 located in needle-shaped trenches 110 are connected to the source wiring structure 116. Further, gate-trench-like trenches 130 are implemented with a trench electrode (e.g. gate line disconnected from gate grid) connected to the source wiring structure 116 by an edge contact 131 (e.g. connection from separated gate line to the source grid) at an edge of the cell region 108. The gate-trench-like trenches 130 may separate the gate trench grid shown in FIG. 2 in two gate trench grids, which are connected to the same gate wiring structure 124.

Layouts as shown in FIGS. 5 and 6 may allow an efficient way to implement adaptions to reduce the gatecharge with respect to different application requirements. FIGS. 5 and 6 indicate how single stripes of the gate grid can be connected to the source, for example. FIG. 5 shows the gate electrode grid without the source grid, while FIG. 6 additionally shows the source grid which includes the connection to the disconnected gate line, for example. A proposed concept to implement a low gatecharge transistor by changing the wiring of the chip is shown. FIG. 5 shows the gate grid and the gate runner and FIG. 6 shows also the source grid. Alternatively, the source grid may also form a closed layer in the active cell region.

For example, in this way any second gate line might be connected to source. Alternatively, less gate lines can be reconfigured in this way (e.g. as gate-trench-like trench 130). As each field-plate trench might still be surrounded by three gate segments, the impact on the on-resistance might not be too severe. For example, a high-speed structure for the 150V to 300V devices may be implemented based on the proposed concept.

Figure 7A:
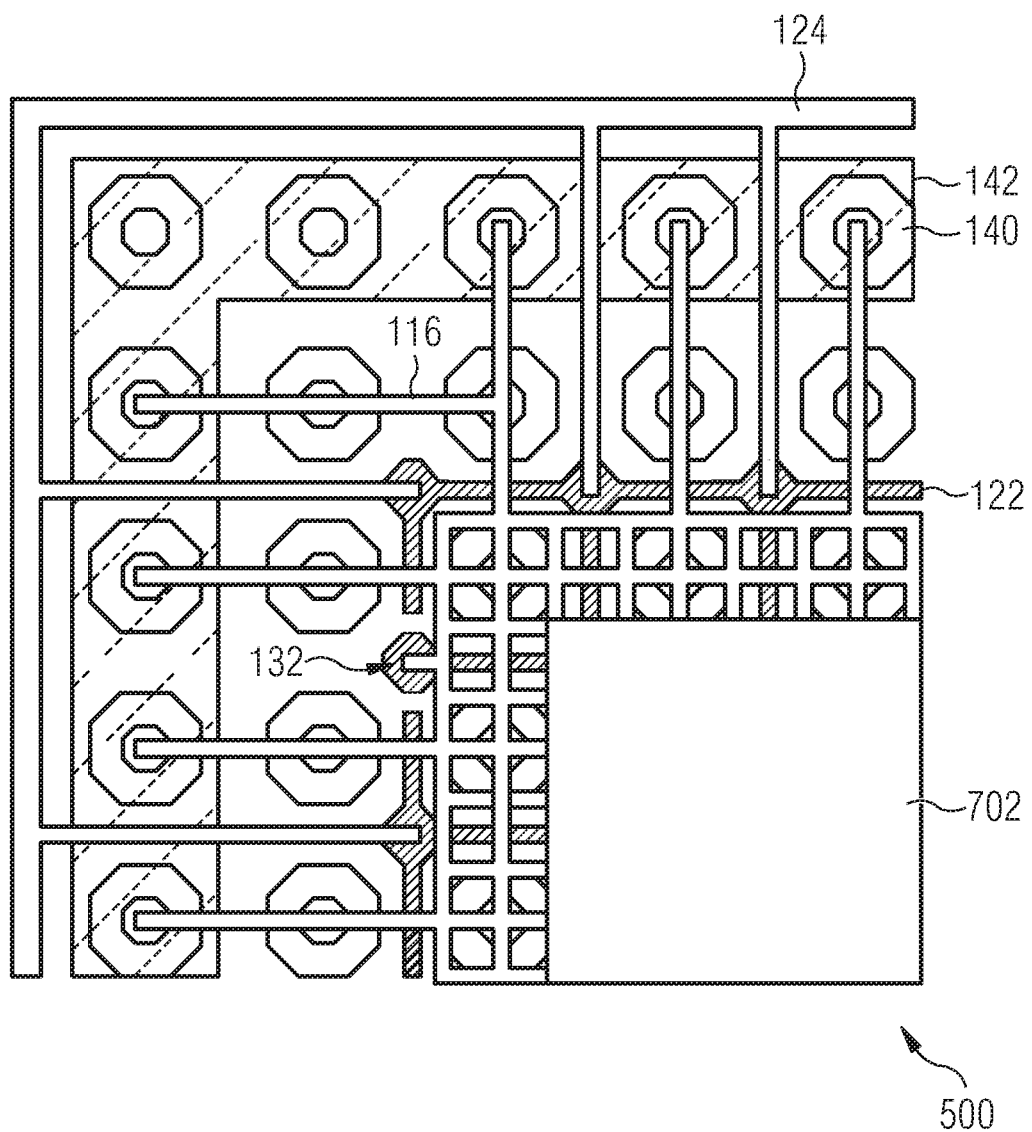
FIG. 7a shows a schematic top view of the semiconductor device shown in FIG. 6 additionally showing a power metal.
Figure 7B:
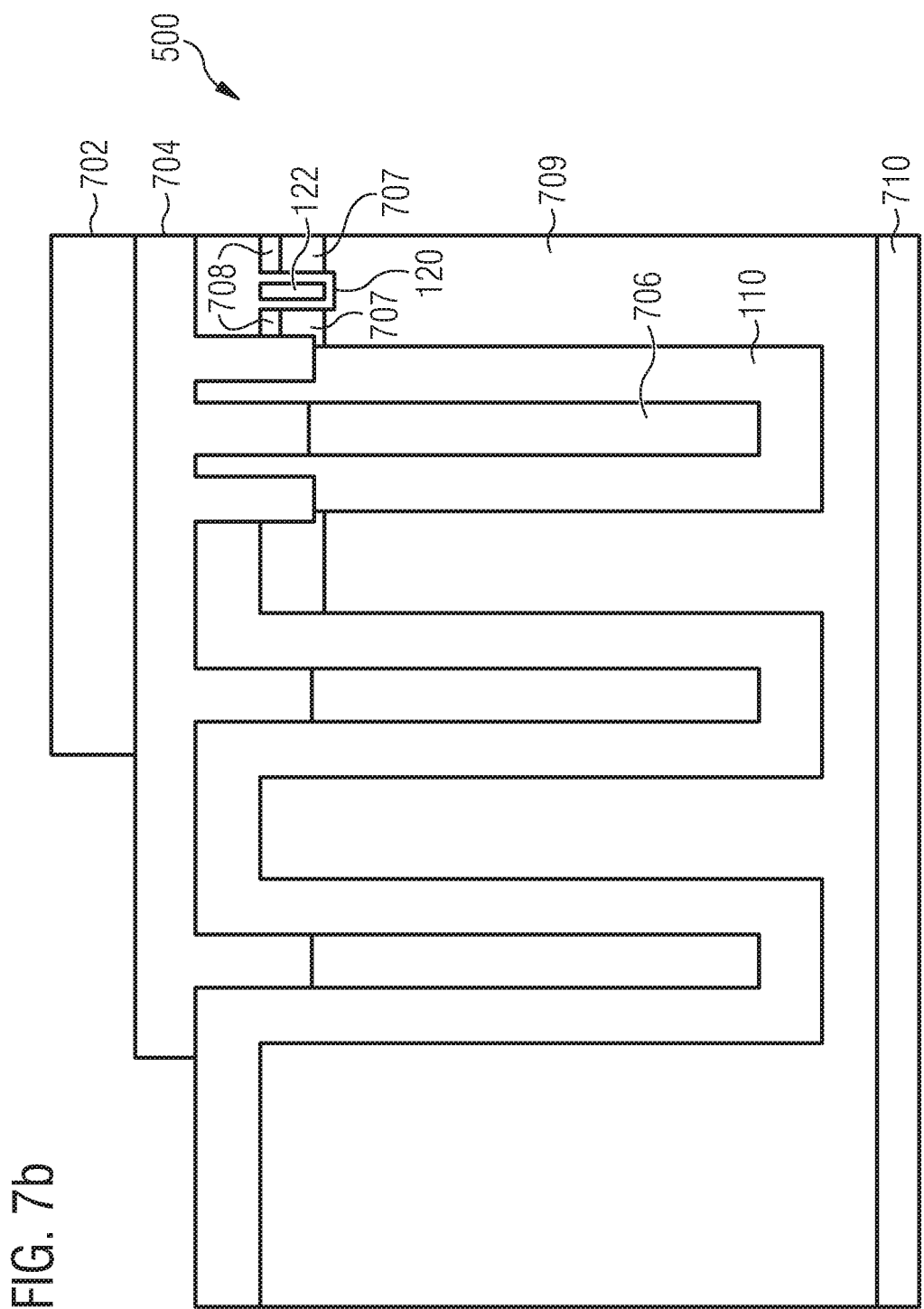

FIG. 7a adds the power metal 702 on top which is connecting the separate parts of the source grid. For illustration, FIG. 7a and FIG. 7b indicate the location of the power metal 702 on top of the metal layer 704 (e.g. implementing at least parts of the source wiring structure 116 and/or the gate wiring structure 124), which does the connection with the outside trenches and the gate runner, for example. The distance of the power metal 702 to the edge of the conductive layer below might be larger than depicted depending on the process used for its structuring. FIG. 7b further shows field electrodes 706 located within the array of needle-shaped trenches 110, body doping regions 707, source doping regions 708, a drift region 709 and a back side drain metallization 710 of the transistor structure.

More details and aspects of the semiconductor device 500 are mentioned in connection with the proposed concept or one or more examples described above or below. The semiconductor device 500 may comprise one or more additional optional features corresponding to one or more aspects of the proposed concept or one or more examples described above (e.g. FIG. 1-4) or below (e.g. FIG. 8-11).

Figure 8:
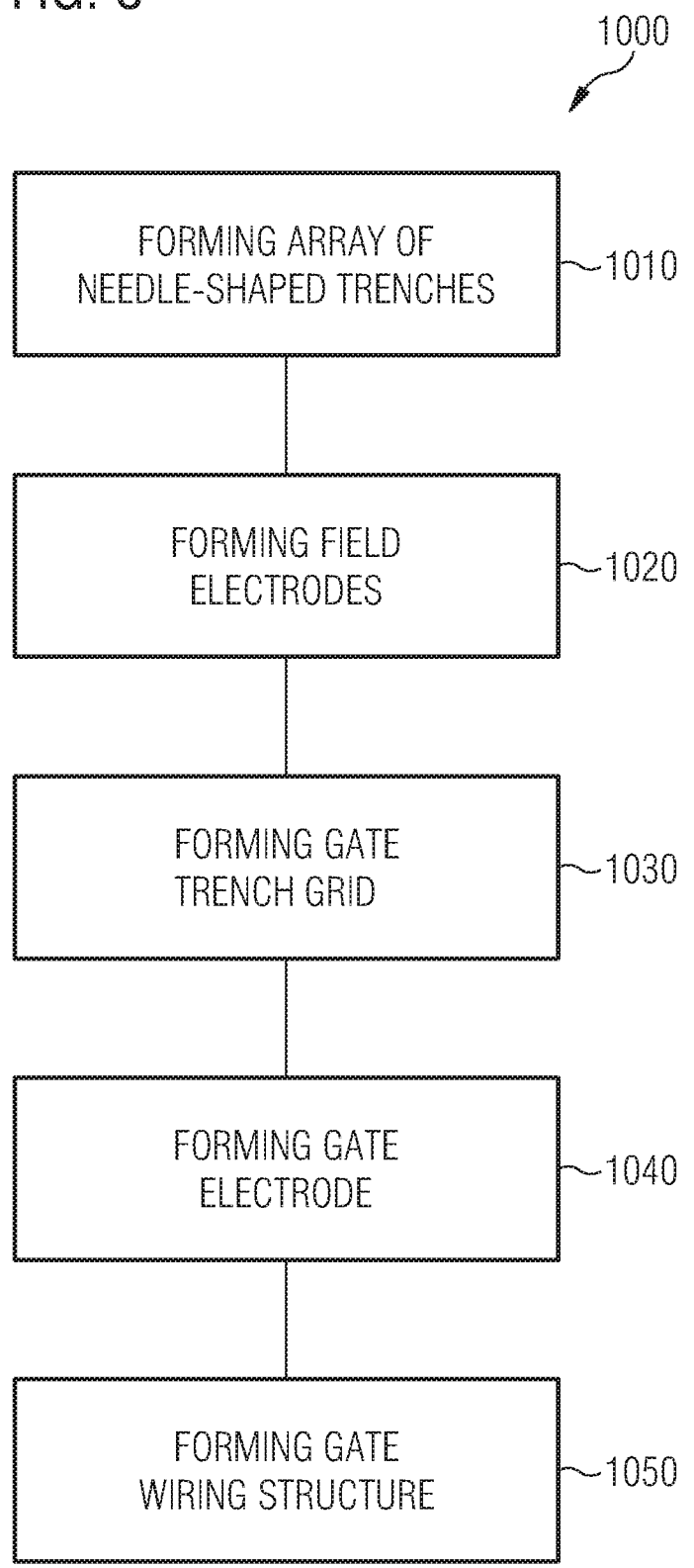
FIG. 8 shows a flow chart of a method for forming a semiconductor device.

FIG. 8 illustrates a flow chart of a method for forming a semiconductor device according to an embodiment. The method 1000 comprises forming 1010 an array of needle-shaped trenches 110 extending into a semiconductor substrate of the semiconductor device. The method 1000 further comprises forming 1020 field electrodes within the array of needle-shaped trenches. The method 1000 further comprises forming 1030 a gate trench grid extending into the semiconductor substrate of the semiconductor device. Additionally, the method 1000 comprises forming 1040 a gate electrode of a transistor structure within the gate trench grid. The method 1000 further comprises forming 1050 a gate wiring structure connected to the gate electrode of the transistor structure and connected to at least one field electrode located within a needle-shaped trench of the array of needle-shaped trenches.

By connecting at least one field electrode located within a needle-shaped trench to the gate wiring structure, a capacitance of the gate may be increased, e.g. to decrease a switching speed, while maintaining a low on-resistance. In this way, the switching speed may be reduced and/or adapted to a desired switching speed for a specific application.

More details and aspects of the method 1000 are mentioned in connection with the proposed concept or one or more examples described above. The method 1000 may comprise one or more additional optional features corresponding to one or more aspects of the proposed concept or one or more examples described above (e.g. FIG. 1 to 7) or below (e.g. FIG. 9a to 11).

FIG. 9a-g show schematic cross sections and top views of a part of a semiconductor device at different manufacturing stages according to an embodiment. FIGS. 9a-9g illustrate exemplary processing steps of a method for forming a semiconductor device as described above (e.g. FIG. 2) or below.

Figure 9A:
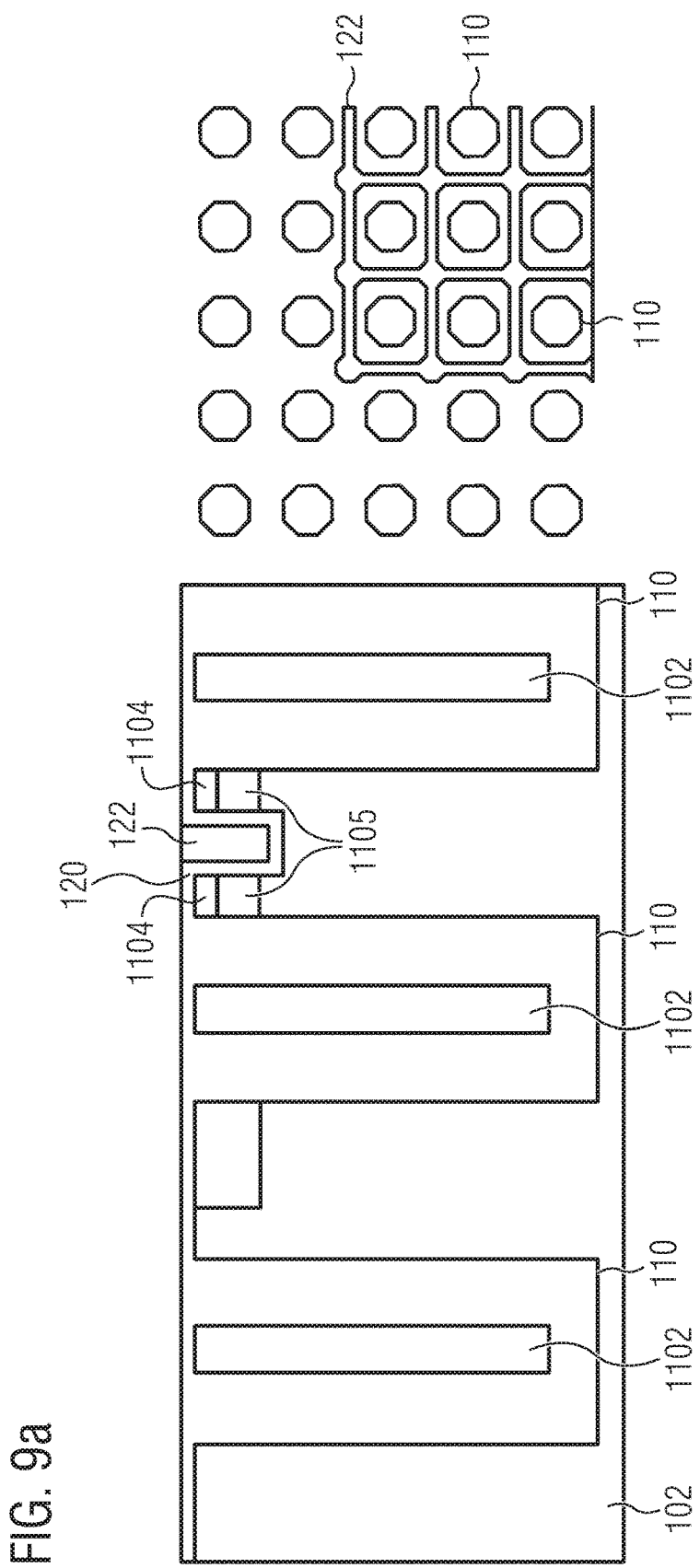

FIG. 9a shows a schematic cross section and top view of needle-shaped trenches of an array of needle-shaped trenches 110, field electrodes 1102 located within the needle-shaped trenches 110, a gate trench of a gate trench grid 120, a gate electrode 122 located within the gate trench, source doping regions 1104 and body doping regions 1105.

FIG. 9a may show the semiconductor device to be formed after forming the field-plate trench, the gate trench and implementing the body/source block.

Figure 9B:
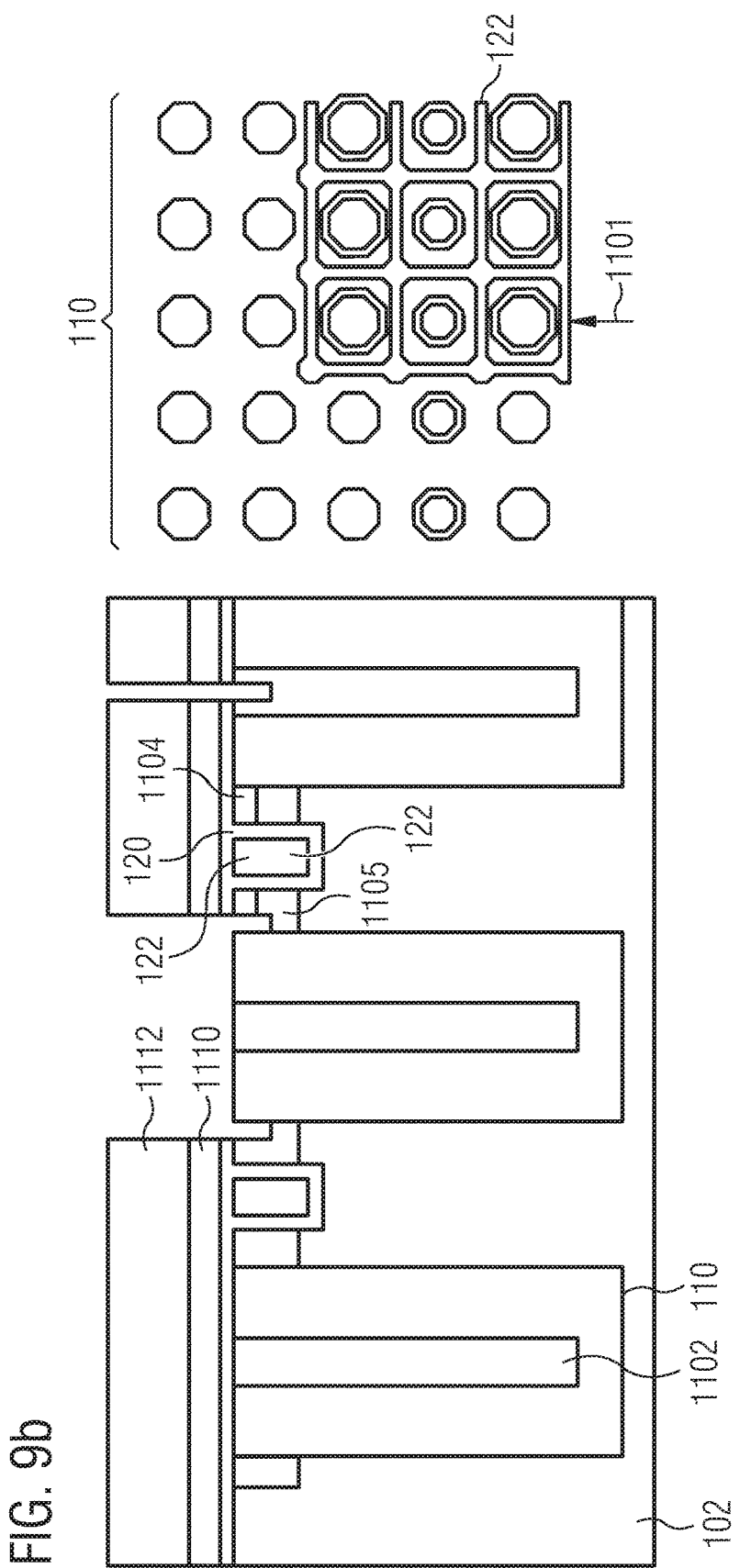

Then a first Pre Metal Dielectric layer 1110 (PMD1) and a (photo) resist layer 1112 is deposited. FIG. 11b additionally shows etching of the first Pre Metal Dielectric 1110 (e.g. $SiO_2$) and etching of groove/source-polysilicon contacts. The cross section shown in FIG. 11b is located at the arrow 1101 shown in the top view of FIG. 9b. FIG. 9b shows the semiconductor device to be formed after PMD1 etch and Groove contact/Field-plate contact etch.

Figure 9C:
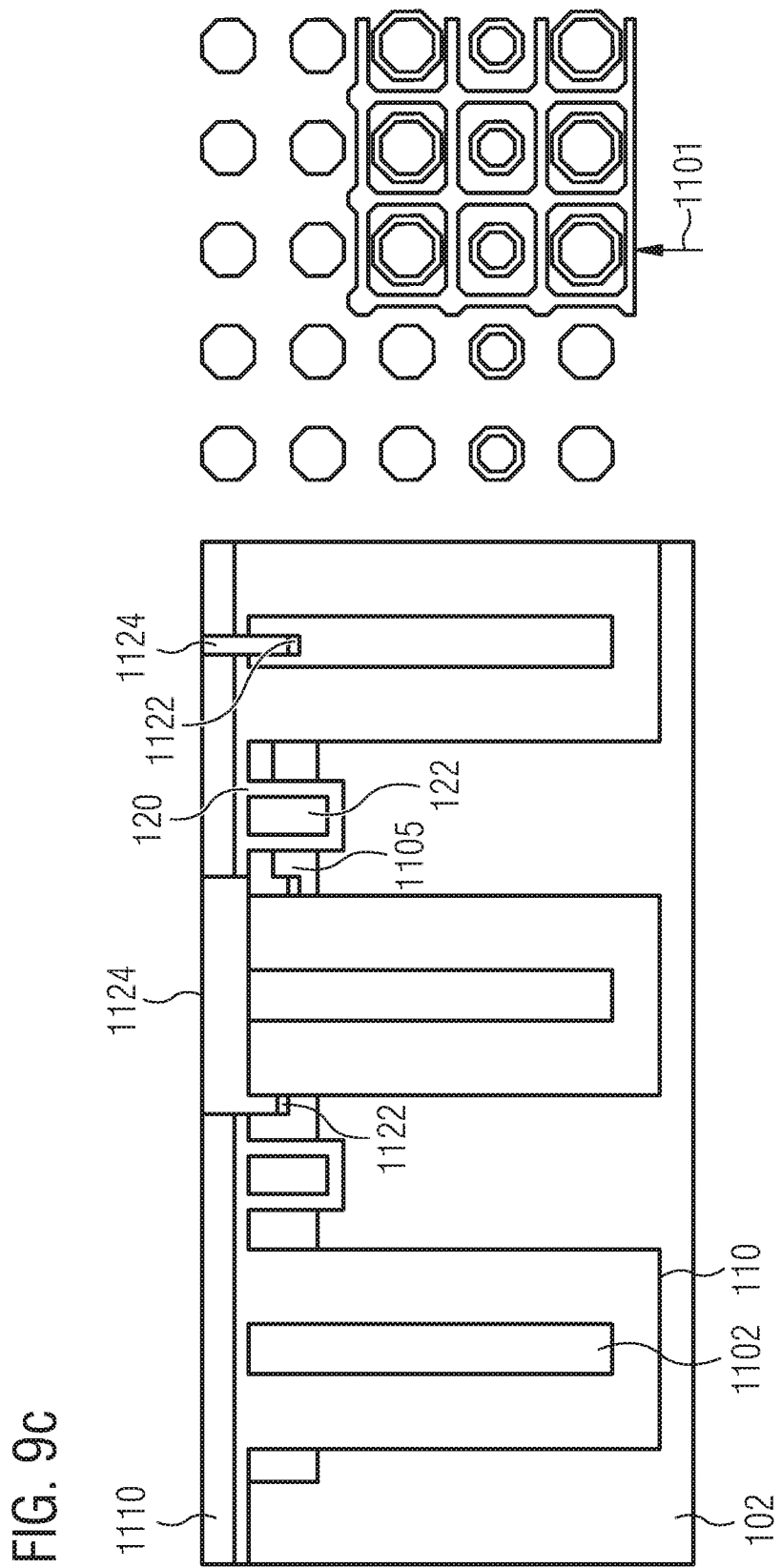

Then a high p (P+) implantation and annealing is performed to form ohmic contact regions 1122. After the P+ implantation and annealing, a Ti/TiN/W layer stack 1124 (Titanium, Titanium nitride, Tungsten) is deposited and the layer stack is planarized by Tungsten Chemical Mechanical Polishing (W CMP). FIG. 9c shows the semiconductor device to be formed after p+ contact implantation and anneal as well as metal 1 deposition and CMP (Ti/TiN/W).

Figure 9D:
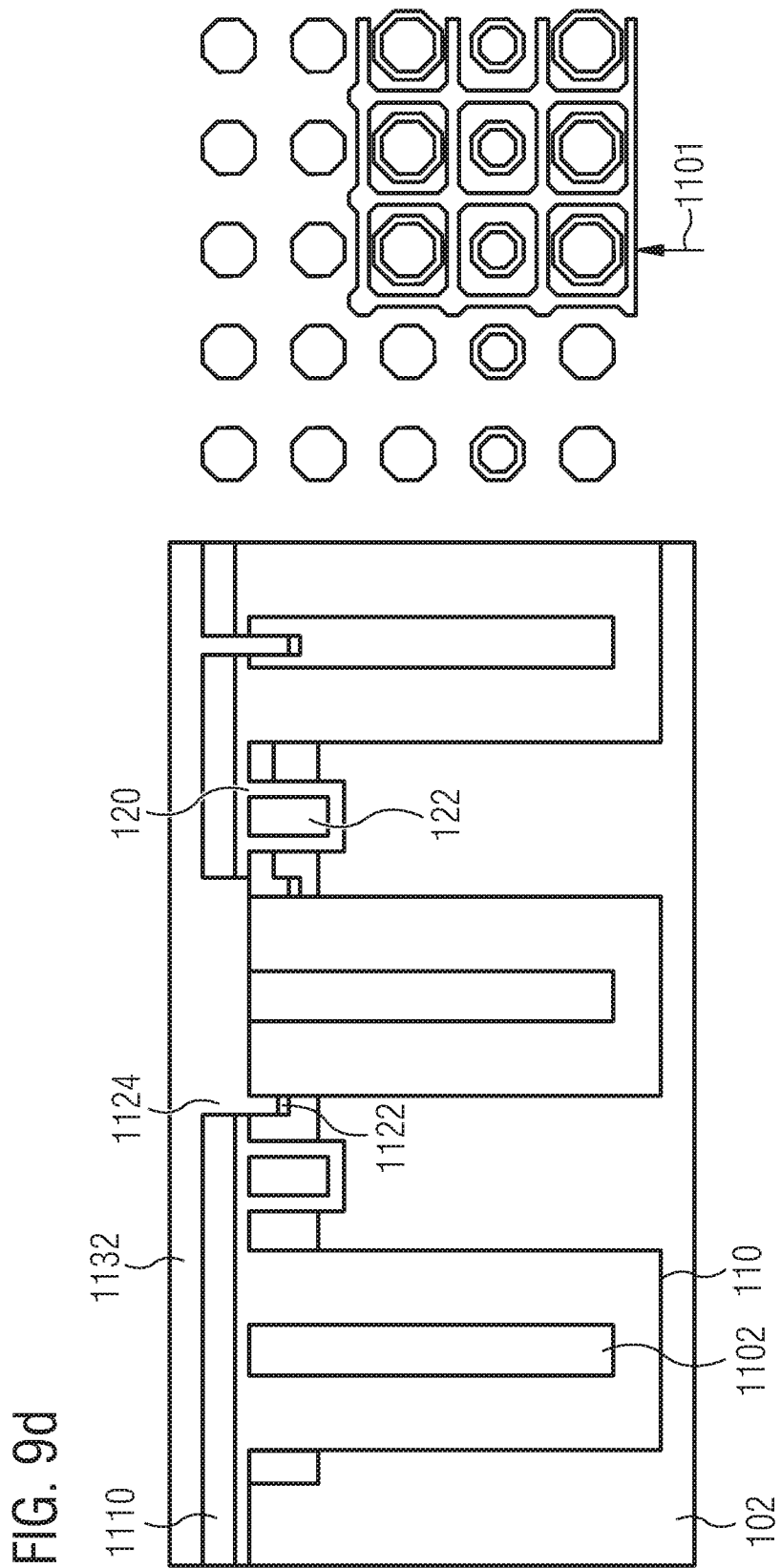

Afterwards a second tungsten layer 1132 is deposited. FIG. 9d shows the semiconductor device to be formed after Metal 2 deposition (W).

Then a second resist layer 1144 is deposited and structured by lithography. Further, the second tungsten layer 1132 is structured by plasma etching (W plasmaetch, W structured). FIG. 9e shows the semiconductor device to be formed after Metal 2 litho and plasmaetch.

Afterwards the second resist layer 1144 is removed and a second Pre Metal Dielectric layer 1152 (PMD2) is deposited. Further, a third resist layer 1154 is deposited and structured by lithography. Then, the second Pre Metal Dielectric layer 1152 is etched. FIG. 9f shows the semiconductor device to be formed after PMD2 deposition, resist, contact litho, PMD etch.

Then, the third resist layer 1154 is removed and another Ti/TiN/W layer stack 1162 (Titanium, Titanium nitride, Tungsten) is deposited and structured (W litho and TiTiNW plasma etch, e.g. gate G/source S structured) to implement a contact to field electrodes and source doping regions for the source wiring structure and/or to implement a contact to the gate electrode in the gate trench grid for the gate wiring structure. FIG. 9g shows the semiconductor device to be formed after Resist strip, Metal 3 deposition (Ti/TiN/W), Litho and Ti/TiN/W plasma etch.

FIG. 9a-9g show an example of a process flow using an additional tungsten layer and its structuring compared to the other process flows.

More details and aspects of the method 1100 are mentioned in connection with the proposed concept or one or more examples described above. The method 1100 may comprise one or more additional optional features corresponding to one or more aspects of the proposed concept or one or more examples described above (e.g. FIG. 1 to 8) or below.

Figure 10:
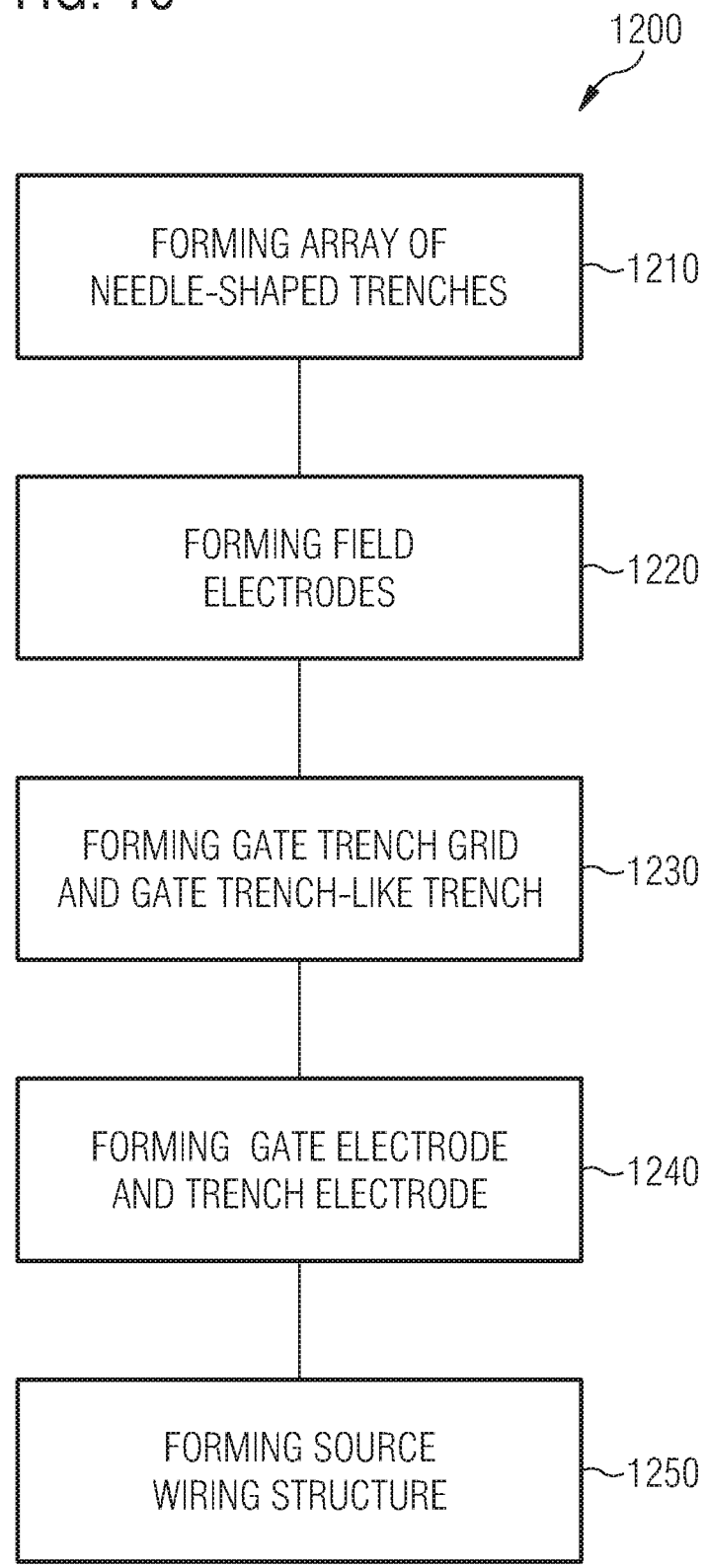
FIG. 10 shows a flow chart of a method for forming a semiconductor device.

FIG. 10 shows a flow chart of a method 1200 for forming a semiconductor device according to an embodiment. The method 1200 comprises forming 1210 an array of needle-shaped trenches extending into a semiconductor substrate of the semiconductor device. The method further comprises forming 1220 field electrodes within the array of needle-shaped trenches. The method 1200 further comprises forming 1230 a gate trench grid extending into the semiconductor substrate of the semiconductor device and a gate-trench-like trench. Additionally, the method 1200 comprises forming 1240 a gate electrode of a transistor structure located within the gate trench grid and a trench electrode located within the gate-trench-like trench. Additionally, the method comprises forming 1250 a source wiring structure of the transistor structure connected to the trench electrode located within the gate-trench-like trench. Additionally, the field electrodes within the array of needle shaped trenches may be connected to the source wiring structure as well (e.g. alternatively, the field electrodes are connected to another wiring structure connectable to a defined potential).

By implementing a gate-trench-like trench with a trench electrode connected to the source wiring structure a semiconductor device with a reduced gate capacitance may be provided. In this way, the maximal switching speed of the semiconductor device may be increased.

For example, the forming 1230 of the gate trench grid and the forming of the gate-trench-like trench may be done simultaneously during one or more common process step (e.g. forming structured mask layer and etching the trenches into the semiconductor substrate). Alternatively, the gate trench grid and the gate-trench-like trench may be formed at different times by different process steps.

For example, the forming 1240 of the gate electrode and the forming of the trench electrode within the gate-trench-like trench may be done simultaneously during one or more common process step (e.g. depositing conductive material into the trenches). Additionally, the field electrodes within the array of needle-shaped trenches may be formed 1260 simultaneously with the gate electrode as well. Alternatively, the gate electrode and the field electrode within the gate-trench-like trench may be formed at different times by different process steps.

More details and aspects of the method 1200 are mentioned in connection with the proposed concept or one or more examples described above or below. The method 1200 may comprise one or more additional optional features corresponding to one or more aspects of the proposed concept or one or more examples described above (e.g. FIG. 1 to 9*g*) or below.

Figure 11:
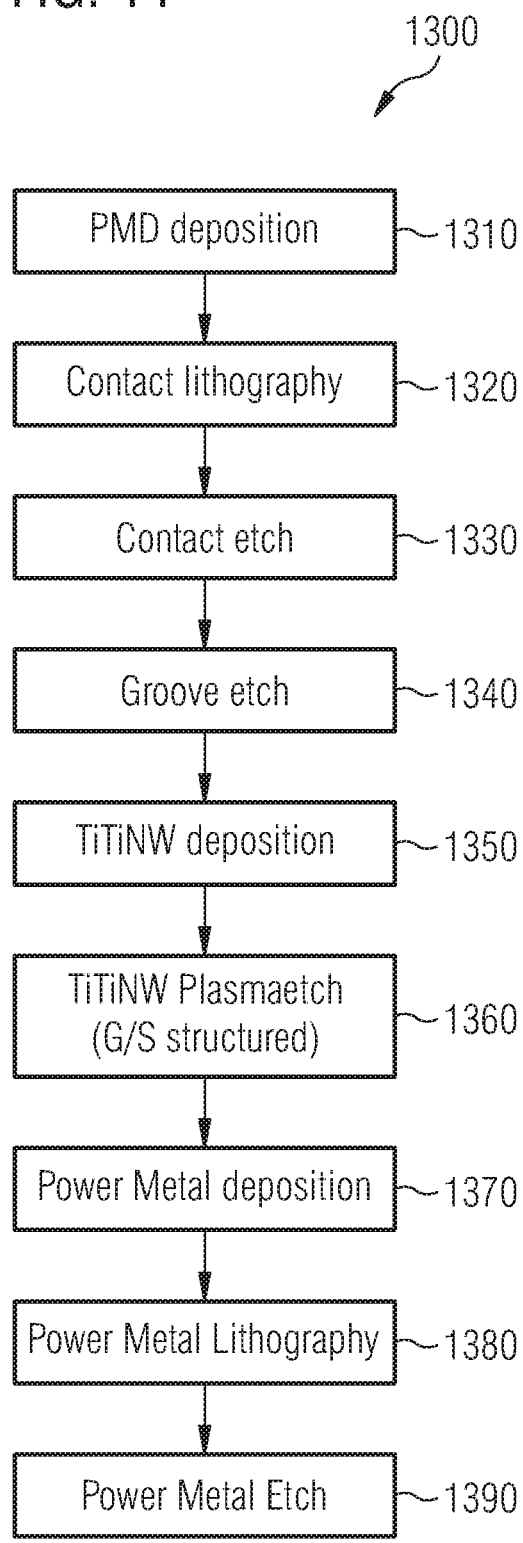
FIG. 11 shows a flow chart of another method for forming a semiconductor device.

FIG. 11 shows a flow chart of a method 1300 for forming a semiconductor device according to an embodiment. The method 1300 may be similar to the method shown in FIG. 12. The method 1300 comprises depositing 1310 of a Pre Metal Dielectric and performing a contact lithography 1320. Further, the method 1300 comprises etching 1330 of contacts (e.g. contact holes through the PMD) and etching 1340 of grooves (e.g. to contact source/body regions). Additionally, the method 1300 comprises depositing 1350 of a Ti/TiN/W layer stack and plasma-etching 1360 of the Ti/TiN/W layer stack (G/S structured). The method 1300 further comprises depositing 1370 a power metal layer and performing lithography 1380 of the power metal as well as etching 1390 of the power metal.

FIG. 11 shows an example of a process sequence for the contact block, which may be compatible with the proposed layout measures.

More details and aspects of the method 1300 are mentioned in connection with the proposed concept or one or more examples described above. The method 1300 may comprise one or more additional optional features corresponding to one or more aspects of the proposed concept or one or more examples described above (e.g. FIG. 1 to 10) or below.

Some embodiments relate to an approach to realize a charge-compensated MOSFET using field-plates in needle-trenches with an improved on-resistance and/or a needle field-plate trench semiconductor device where the field-plate is partially or completely connected to the gate, for example. Some further embodiments relate to a layout based option for charge-compensated devices using a needle-shaped fieldplate to improve FOMg (Figure Of Merit Gate charge), FOMgd (Gate-Drain Charge Figure Of Merit) and/or switching speed.

For example, an adaption to the application might be desired, which may call for a slow-down of the switching speed. This might be the case for high-power motor-drive applications, where it may be required to parallel several devices and to limit the dv/dt and di/dt during the switching process to prevent potential damages to the wire insulation in the motor as well as to reduce losses caused by displacement currents from the motor windings to ground (e.g. the stator of a machine).

In some systems, the field-plates of stripe cells having the gate integrated into the field-plate trench might be partly or completely connected to the gate. This may increase the gate charge significantly, but as switching frequencies may be low in such applications, it might not have much influence on the total losses. However, there might be limitations by the gate driver, which might have to be able to deliver higher gate currents for such a device. On the other hand, the area-specific on-resistance of such a structure may be improved since the slight depletion region formed by the field-plate being at zero potential may be changed into a light accumulation region, as the field-plate is now at the positive gate potential. This effect may easily improve the $R_{dson} \cdot A$ by 10%, for example.

Different to a needle-trench part with reduced gatecharge, which may be realized by changes to the layout, this is often not so easily possible for the device derivative discussed before.

An aspect relates to an approach to realize a device with minimized on-resistance and slower switching speed, for example.

Also for some systems, it may be expected that an adaption to the application requirements with respect to a gate charge/switching speed may be desired. For example, to allow an easier paralleling and do reduce the dv/dt and di/dt during the switching, a part of the field-plates may be connected to gate instead to source. Such a measure may increase the gate charge and gate-drain charge and allows a tuning of the switching speed. Additionally, an improvement in $R_{dson} \cdot A$ may be gained for the part of the cells where the field-plate is connected to source.

Other applications may require fast switching. In such cases, a part of the gates may be connected to source to reduce the gate charge. A negative side effect of this measure may be an increase of $R_{dson} \cdot A$, as a part of the channels is eliminated. However, this effect may be negligible for structures with higher blocking voltages (e.g. >200V), as here the overall on-resistance may be dominated by the resistance of the drift region (even if it is charge-compensated).

At least some embodiments may provide an approach to realize a device having a reduced on-resistance and slower switching speed.

For example, the gate is not integrated into the field-plate trench but moved into a separate gate trench. Also for these devices it may be expected that an adaption to the application needs with respect to gatecharge/switching speed may be desired. For example, to allow an easier paralleling and to reduce the dv/dt and di/dt during the switching, a part of the field-plates may be connected to gate instead to source. Such a measure may increase the gate charge and gate-drain charge and may allow a tuning of the switching speed. Additionally, an improvement in $R_{dson} \cdot A$ may be gained for the part of the cells where the field-plate is connected to source.

Other applications may require fast switching. In such cases a part of the gates may be connected to source to reduce the gatecharge. However, an increase in $R_{dson} \cdot A$ may be obtained as a part of the channels is eliminated. However, this effect may become negligible for structures with higher blocking voltages (>200V) as here the overall on-resistance may be dominated by the resistance of the drift region (even if it is charge-compensated).

An aspect relates to layout-based approaches to realize such derivatives in a technology employing needle-shaped field-plates and a separate gate trench grid, for example.

Some embodiments may provide a concept for a layout of a vertical MOSFET device employing charge-compensation by a field-plate in a needle-shaped trench. For example, the disconnection of single gate lines and connecting them to the source grid instead of the gate grid by changing just a single mask may be enabled based on the proposed concept. No additional process steps may be needed.

Some embodiments relate to a partially disconnected grid-like gate layout in a needle field plate device where a gate is always present at three sides of the needle-trench, the gates are connected only at the outer part of the chip to the gate pad via a gate runner (e.g. no floating gate nor gate contacts in the active cell field) and/or the gate line disconnected from the gate grid is connected to the source grid or source metal layer, respectively.

Some embodiments may provide a concept for a layout of a vertical MOSFET device employing charge-compensation by a field-plate in a needle-shaped trench. For example, a part or all of the field-plate electrodes may be connected to the gate to increase the gate charge and to reduce the area-specific on-resistance, in order to better address the requirements of high-current motor-drive applications running at low switching frequencies.

Some embodiments relate to a needle field-plate trench device, where the field-plate is partially or completely connected to the gate where gate and field-plate are located in separate trenches and where the field-plate trench has a greater depth and a ticker insulation layer than the gate trench. Further, the gate grid and field-plates on gate potential are connected to the gate runner via connecting lines and/or the source contacts and the field-plates on source potential are connected to the source metal via plugs (e.g. may mean there is no uninterrupted source grid below the power metal).

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
an array of needle-shaped trenches extending into a semiconductor substrate;
a gate trench grid extending into the semiconductor substrate; and
a gate electrode of a transistor structure located within the gate trench grid, wherein a gate wiring structure of the transistor structure is connected to the gate electrode of the transistor structure, wherein a field electrode located within at least one needle-shaped trench of the array of needle-shaped trenches is connected to the gate wiring structure of the transistor structure, wherein a field electrode located within at least one needle-shaped trench of the array of needle-shaped trenches is connected to a source wiring structure of the transistor structure.

2. The semiconductor device of claim 1, wherein a plurality of needle-shaped trenches of the array of needle-shaped trenches comprise field electrodes connected to the gate wiring structure, wherein the plurality of needle-shaped trenches of the array of needle-shaped trenches comprising field electrodes connected to the gate wiring structure are arranged in rows, and wherein the rows are periodically distributed over a cell region of the semiconductor substrate.

3. The semiconductor device of claim 1, wherein a number of needle-shaped trenches of the array of needle-shaped trenches comprising field electrodes connected to the source wiring structure of the transistor structure is larger than a number of needle-shaped trenches of the array of needle-shaped trenches comprising field electrodes connected to the gate wiring structure of the transistor structure.

4. A semiconductor device, comprising:
an array of needle-shaped trenches extending into a semiconductor substrate;
a gate trench grid extending into the semiconductor substrate;
a gate electrode of a transistor structure located within the gate trench grid;
a gate-trench-like trench; and
a trench electrode located within the gate-trench-like trench and connected to a source wiring structure of the transistor structure,
wherein a depth of the gate-trench-like trench differs from a depth of the gate trench grid by less than 10% of the depth of the gate trench grid.

5. The semiconductor device of claim 4, wherein a smallest lateral distance between the gate trench grid and the gate-trench-like trench is larger than 200 nm and lower than 2 µm.

6. The semiconductor device of claim 4, wherein a plurality of gate-trench-like trenches is located within a cell region of the semiconductor substrate, and wherein the plurality of gate-trench-like trenches is spaced apart from each other by substantially equal distances.

7. The semiconductor device of claim 4, wherein the needle-shaped trenches of the array of needle-shaped trenches have a maximal lateral extension in one lateral direction of less than 2 times a minimal lateral extension in another lateral direction.

8. The semiconductor device of claim 4, wherein the needle-shaped trenches of the array of needle-shaped trenches have a lateral geometry being one of a rectangular geometry, square geometry, round geometry, hexagonal geometry and octagonal geometry.

9. The semiconductor device of claim 4, wherein the needle-shaped trenches of the array of needle-shaped trenches have a minimal lateral dimension of more than 300 nm and less than 3 µm.

10. The semiconductor device of claim 4, wherein a minimal width of the trench of the gate trench grid is less than 50% of a minimal lateral dimension of the needle-shaped trenches of the array of needle-shaped trenches.

11. The semiconductor device of claim 4, wherein the needle-shaped trenches of the array of needle-shaped trenches are located within a cell region of the semiconductor substrate.

12. The semiconductor device of claim 11, further comprising a plurality of edge termination needle-shaped trenches located within an edge termination region laterally surrounding the cell region of the semiconductor device.

13. The semiconductor device of claim 4, wherein a depth of the needle-shaped trenches of the array of needle-shaped trenches is larger than two times a depth of the gate trench grid.

14. The semiconductor device of claim 4, wherein an insulation layer located within the needle-shaped trenches of the array of needle-shaped trenches has a thickness larger than two times a thickness of a gate insulation layer located within the gate trench grid.

15. The semiconductor device of claim 4, wherein at least one of the gate wiring structure and the source wiring structure are implemented at one or more metal layers of the semiconductor device formed on the semiconductor substrate.

16. The semiconductor device of claim 4, wherein at least one of the gate wiring structure and the source wiring structure comprises at least one of tungsten, aluminum and copper.

17. The semiconductor device of claim 4, wherein the transistor structure has a blocking voltage of more than 10V.

18. A method for forming a semiconductor device, the method comprising:
forming an array of needle-shaped trenches extending into a semiconductor substrate;
forming field electrodes within the array of needle-shaped trenches;
forming a gate trench grid extending into the semiconductor substrate;
forming a gate electrode of a transistor structure within the gate trench grid;
forming a gate wiring structure connected to the gate electrode of the transistor structure and connected to at least one field electrode located within a needle-shaped trench of the array of needle-shaped trenches; and
connecting a field electrode located within at least one needle-shaped trench of the array of needle-shaped trenches to a source wiring structure of the transistor structure.

* * * * *